US009171836B2

(12) United States Patent
Lal et al.

(10) Patent No.: US 9,171,836 B2
(45) Date of Patent: Oct. 27, 2015

(54) METHOD OF FORMING ELECTRONIC COMPONENTS WITH INCREASED RELIABILITY

(71) Applicant: Transphorm Inc., Goleta, CA (US)

(72) Inventors: Rakesh K. Lal, Isla Vista, CA (US); Robert Coffie, Camarillo, CA (US); Yifeng Wu, Goleta, CA (US); Primit Parikh, Goleta, CA (US); Yuvaraj Dora, Goleta, CA (US); Umesh Mishra, Montecito, CA (US); Srabanti Chowdhury, Goleta, CA (US); Nicholas Fichtenbaum, Newbury Park, CA (US)

(73) Assignee: Transphorm Inc., Goleta, CA (US)

( * ) Notice: Subject to any disclaimer, the term of this patent is extended or adjusted under 35 U.S.C. 154(b) by 0 days.

(21) Appl. No.: 14/478,504

(22) Filed: Sep. 5, 2014

(65) Prior Publication Data

US 2014/0377930 A1    Dec. 25, 2014

Related U.S. Application Data

(60) Division of application No. 14/068,944, filed on Oct. 31, 2013, now Pat. No. 8,860,495, which is a continuation of application No. 13/269,367, filed on Oct. 7, 2011, now Pat. No. 8,598,937.

(51) Int. Cl.
*H03K 17/687* (2006.01)
*H01L 27/02* (2006.01)
(Continued)

(52) U.S. Cl.
CPC ........ *H01L 27/0288* (2013.01); *H01L 21/8236* (2013.01); *H01L 25/00* (2013.01);
(Continued)

(58) Field of Classification Search
CPC ................. H01L 21/8236; H01L 2017/6875
USPC ................................. 327/427, 430, 436, 437
See application file for complete search history.

(56) References Cited

U.S. PATENT DOCUMENTS 4,300,091 A    11/1981 Schade, Jr.
4,532,439 A    7/1985 Koike
(Continued)

FOREIGN PATENT DOCUMENTS

CN    1748320    3/2006
CN    101107713    1/2008
(Continued)

OTHER PUBLICATIONS

Authorized officer Chung Keun Lee, International Search Report and Written Opinion in PCT/US2008/076030, mailed Mar. 23, 2009, 10 pages.
(Continued)

*Primary Examiner* — Kenneth B Wells
(74) *Attorney, Agent, or Firm* — Fish & Richardson P.C.

(57) ABSTRACT

An electronic component includes a depletion-mode transistor, an enhancement-mode transistor, and a resistor. The depletion-mode transistor has a higher breakdown voltage than the enhancement-mode transistor. A first terminal of the resistor is electrically connected to a source of the enhancement-mode transistor, and a second terminal of the resistor and a source of the depletion-mode transistor are each electrically connected to a drain of the enhancement-mode transistor. A gate of the depletion-mode transistor can be electrically connected to a source of the enhancement-mode transistor.

32 Claims, 7 Drawing Sheets

(51) Int. Cl.
*H01L 25/00* (2006.01)
*H01L 21/8236* (2006.01)
*H01L 27/06* (2006.01)
*H01L 49/02* (2006.01)
*H01L 29/778* (2006.01)
*H03K 17/10* (2006.01)
*H01L 29/423* (2006.01)
*H01L 29/872* (2006.01)
*H01L 29/20* (2006.01)

(52) U.S. Cl.
CPC ............ *H01L27/0629* (2013.01); *H01L 28/20* (2013.01); *H01L 29/4238* (2013.01); *H01L 29/7786* (2013.01); *H03K 17/102* (2013.01); *H01L 29/2003* (2013.01); *H01L 29/42376* (2013.01); *H01L 29/872* (2013.01); *H01L 2924/0002* (2013.01); *H03K 2017/6875* (2013.01); *Y10T 29/49117* (2015.01)

(56) References Cited

U.S. PATENT DOCUMENTS

| | | | |
|---|---|---|---|
| 4,645,562 | A | 2/1987 | Liao et al. |
| 4,728,826 | A | 3/1988 | Einzinger et al. |
| 4,821,093 | A | 4/1989 | Iafrate et al. |
| 4,914,489 | A | 4/1990 | Awano |
| 5,051,618 | A | 9/1991 | Lou |
| 5,329,147 | A | 7/1994 | Vo et al. |
| 5,618,384 | A | 4/1997 | Chan et al. |
| 5,646,069 | A | 7/1997 | Jelloian et al. |
| 5,663,091 | A | 9/1997 | Yen et al. |
| 5,705,847 | A | 1/1998 | Kashiwa et al. |
| 5,714,393 | A | 2/1998 | Wild et al. |
| 5,909,103 | A | 6/1999 | Williams |
| 5,998,810 | A | 12/1999 | Hatano et al. |
| 6,008,684 | A | 12/1999 | Ker et al. |
| 6,097,046 | A | 8/2000 | Plumton |
| 6,100,571 | A | 8/2000 | Mizuta et al. |
| 6,292,500 | B1 | 9/2001 | Kouchi et al. |
| 6,307,220 | B1 | 10/2001 | Yamazaki |
| 6,316,793 | B1 | 11/2001 | Sheppard et al. |
| 6,373,082 | B1 | 4/2002 | Ohno et al. |
| 6,429,468 | B1 | 8/2002 | Hsu et al. |
| 6,475,889 | B1 | 11/2002 | Ring |
| 6,486,502 | B1 | 11/2002 | Sheppard et al. |
| 6,504,235 | B2 | 1/2003 | Schmitz et al. |
| 6,515,303 | B2 | 2/2003 | Ring |
| 6,548,333 | B2 | 4/2003 | Smith |
| 6,552,373 | B2 | 4/2003 | Ando et al. |
| 6,580,101 | B2 | 6/2003 | Yoshida |
| 6,583,454 | B2 | 6/2003 | Sheppard et al. |
| 6,586,781 | B2 | 7/2003 | Wu et al. |
| 6,624,452 | B2 | 9/2003 | Yu et al. |
| 6,649,497 | B2 | 11/2003 | Ring |
| 6,727,531 | B1 | 4/2004 | Redwing et al. |
| 6,746,938 | B2 | 6/2004 | Uchiyama et al. |
| 6,777,278 | B2 | 8/2004 | Smith |
| 6,849,882 | B2 | 2/2005 | Chavarkar et al. |
| 6,867,078 | B1 | 3/2005 | Green et al. |
| 6,914,273 | B2 | 7/2005 | Ren et al. |
| 6,946,739 | B2 | 9/2005 | Ring |
| 6,979,863 | B2 | 12/2005 | Ryu |
| 6,982,204 | B2 | 1/2006 | Saxler et al. |
| 7,030,428 | B2 | 4/2006 | Saxler |
| 7,045,404 | B2 | 5/2006 | Sheppard et al. |
| 7,053,413 | B2 | 5/2006 | D'Evelyn et al. |
| 7,071,498 | B2 | 7/2006 | Johnson et al. |
| 7,078,743 | B2 | 7/2006 | Murata et al. |
| 7,084,475 | B2 | 8/2006 | Shelton et al. |
| 7,109,552 | B2 | 9/2006 | Wu |
| 7,125,786 | B2 | 10/2006 | Ring et al. |
| 7,126,212 | B2 | 10/2006 | Enquist et al. |
| 7,161,194 | B2 | 1/2007 | Parikh et al. |
| 7,169,634 | B2 | 1/2007 | Zhao et al. |
| 7,170,111 | B2 | 1/2007 | Saxler |
| 7,199,640 | B2 | 4/2007 | De Cremoux et al. |
| 7,217,960 | B2 | 5/2007 | Ueno et al. |
| 7,230,284 | B2 | 6/2007 | Parikh et al. |
| 7,238,560 | B2 | 7/2007 | Sheppard et al. |
| 7,250,641 | B2 | 7/2007 | Saito et al. |
| 7,253,454 | B2 | 8/2007 | Saxler |
| 7,265,399 | B2 | 9/2007 | Sriram et al. |
| 7,268,375 | B2 | 9/2007 | Shur et al. |
| 7,304,331 | B2 | 12/2007 | Saito et al. |
| 7,321,132 | B2 | 1/2008 | Robinson et al. |
| 7,326,971 | B2 | 2/2008 | Harris et al. |
| 7,332,795 | B2 | 2/2008 | Smith et al. |
| 7,364,988 | B2 | 4/2008 | Harris et al. |
| 7,375,407 | B2 | 5/2008 | Yanagihara et al. |
| 7,382,001 | B2 | 6/2008 | Beach |
| 7,388,236 | B2 | 6/2008 | Wu et al. |
| 7,419,892 | B2 | 9/2008 | Sheppard et al. |
| 7,429,534 | B2 | 9/2008 | Gaska et al. |
| 7,432,142 | B2 | 10/2008 | Saxler et al. |
| 7,436,001 | B2 | 10/2008 | Lee et al. |
| 7,449,730 | B2 | 11/2008 | Kuraguchi |
| 7,456,443 | B2 | 11/2008 | Saxler et al. |
| 7,465,967 | B2 | 12/2008 | Smith et al. |
| 7,465,997 | B2 | 12/2008 | Kinzer et al. |
| 7,482,788 | B2 | 1/2009 | Yang |
| 7,488,992 | B2 | 2/2009 | Robinson |
| 7,501,669 | B2 | 3/2009 | Parikh et al. |
| 7,501,670 | B2 | 3/2009 | Murphy |
| 7,508,014 | B2 | 3/2009 | Tanimoto |
| 7,544,963 | B2 | 6/2009 | Saxler |
| 7,547,925 | B2 | 6/2009 | Wong et al. |
| 7,548,112 | B2 | 6/2009 | Sheppard |
| 7,550,781 | B2 | 6/2009 | Kinzer et al. |
| 7,550,783 | B2 | 6/2009 | Wu et al. |
| 7,550,784 | B2 | 6/2009 | Saxler et al. |
| 7,566,580 | B2 | 7/2009 | Keller et al. |
| 7,566,918 | B2 | 7/2009 | Wu et al. |
| 7,573,078 | B2 | 8/2009 | Wu et al. |
| 7,592,211 | B2 | 9/2009 | Sheppard et al. |
| 7,598,108 | B2 | 10/2009 | Li et al. |
| 7,601,993 | B2 | 10/2009 | Hoshi et al. |
| 7,605,017 | B2 | 10/2009 | Hayashi et al. |
| 7,612,363 | B2 | 11/2009 | Takeda et al. |
| 7,612,390 | B2 | 11/2009 | Saxler et al. |
| 7,615,774 | B2 | 11/2009 | Saxler |
| 7,629,627 | B2 | 12/2009 | Mil'shtein et al. |
| 7,638,818 | B2 | 12/2009 | Wu et al. |
| 7,655,962 | B2 | 2/2010 | Simin et al. |
| 7,678,628 | B2 | 3/2010 | Sheppard et al. |
| 7,692,263 | B2 | 4/2010 | Wu et al. |
| 7,700,973 | B2 | 4/2010 | Shen et al. |
| 7,709,269 | B2 | 5/2010 | Smith et al. |
| 7,709,859 | B2 | 5/2010 | Smith et al. |
| 7,714,360 | B2 | 5/2010 | Otsuka et al. |
| 7,723,739 | B2 | 5/2010 | Takano et al. |
| 7,728,356 | B2 | 6/2010 | Suh et al. |
| 7,745,851 | B2 | 6/2010 | Harris |
| 7,755,108 | B2 | 7/2010 | Kuraguchi |
| 7,759,699 | B2 | 7/2010 | Beach |
| 7,759,700 | B2 | 7/2010 | Ueno et al. |
| 7,777,252 | B2 | 8/2010 | Sugimoto et al. |
| 7,777,254 | B2 | 8/2010 | Sato |
| 7,795,622 | B2 | 9/2010 | Kikkawa et al. |
| 7,795,642 | B2 | 9/2010 | Suh et al. |
| 7,811,872 | B2 | 10/2010 | Hoshi et al. |
| 7,812,369 | B2 | 10/2010 | Chini et al. |
| 7,834,380 | B2 | 11/2010 | Ueda et al. |
| 7,843,017 | B2 * | 11/2010 | Cheng et al. .................. 257/392 |
| 7,851,825 | B2 | 12/2010 | Suh et al. |
| 7,855,401 | B2 | 12/2010 | Sheppard et al. |
| 7,859,014 | B2 | 12/2010 | Nakayama et al. |
| 7,859,020 | B2 | 12/2010 | Kikkawa et al. |
| 7,859,021 | B2 | 12/2010 | Kaneko |
| 7,875,537 | B2 | 1/2011 | Suvorov et al. |
| 7,875,907 | B2 | 1/2011 | Honea et al. |
| 7,875,910 | B2 | 1/2011 | Sheppard et al. |
| 7,875,914 | B2 | 1/2011 | Sheppard |
| 7,884,394 | B2 | 2/2011 | Wu et al. |

(56) References Cited

U.S. PATENT DOCUMENTS

| | | | |
|---|---|---|---|
| 7,884,395 B2 | 2/2011 | Saito | |
| 7,892,974 B2 | 2/2011 | Ring et al. | |
| 7,893,424 B2 | 2/2011 | Eichler et al. | |
| 7,893,500 B2 | 2/2011 | Wu et al. | |
| 7,898,004 B2 | 3/2011 | Wu et al. | |
| 7,901,994 B2 | 3/2011 | Saxler et al. | |
| 7,906,799 B2 | 3/2011 | Sheppard et al. | |
| 7,915,643 B2 | 3/2011 | Suh et al. | |
| 7,915,644 B2 | 3/2011 | Wu et al. | |
| 7,919,791 B2 | 4/2011 | Flynn et al. | |
| 7,928,475 B2 | 4/2011 | Parikh et al. | |
| 7,932,539 B2 | 4/2011 | Chen et al. | |
| 7,935,985 B2 | 5/2011 | Mishra et al. | |
| 7,939,391 B2 | 5/2011 | Suh et al. | |
| 7,943,445 B2 * | 5/2011 | Anderson et al. | 438/157 |
| 7,948,011 B2 | 5/2011 | Rajan et al. | |
| 7,955,918 B2 | 6/2011 | Wu et al. | |
| 7,955,984 B2 | 6/2011 | Ohki | |
| 7,960,756 B2 | 6/2011 | Sheppard et al. | |
| 7,965,126 B2 | 6/2011 | Honea et al. | |
| 7,973,335 B2 | 7/2011 | Okamoto et al. | |
| 7,982,242 B2 | 7/2011 | Goto | |
| 7,985,986 B2 | 7/2011 | Heikman et al. | |
| 7,985,987 B2 | 7/2011 | Kaneko | |
| 8,039,352 B2 | 10/2011 | Mishra et al. | |
| 8,049,252 B2 | 11/2011 | Smith et al. | |
| 8,076,698 B2 | 12/2011 | Ueda et al. | |
| 8,076,699 B2 | 12/2011 | Chen et al. | |
| 8,084,783 B2 * | 12/2011 | Zhang | 257/133 |
| 8,093,606 B2 | 1/2012 | Sonobe et al. | |
| 8,110,425 B2 | 2/2012 | Yun | |
| 8,114,717 B2 | 2/2012 | Palacios et al. | |
| 8,153,515 B2 | 4/2012 | Saxler | |
| 8,174,048 B2 | 5/2012 | Beach | |
| 8,178,900 B2 | 5/2012 | Kurachi et al. | |
| 8,223,458 B2 | 7/2012 | Mochizuki et al. | |
| 8,237,196 B2 | 8/2012 | Saito | |
| 8,237,198 B2 | 8/2012 | Wu et al. | |
| 8,254,073 B1 * | 8/2012 | Choy et al. | 361/91.1 |
| 8,264,003 B2 | 9/2012 | Herman | |
| 8,361,816 B2 | 1/2013 | Lee et al. | |
| 8,363,437 B2 | 1/2013 | Wang et al. | |
| 8,389,975 B2 | 3/2013 | Kikuchi et al. | |
| 8,390,000 B2 | 3/2013 | Chu et al. | |
| 8,404,042 B2 | 3/2013 | Mizuhara et al. | |
| 8,431,960 B2 | 4/2013 | Beach et al. | |
| 8,455,885 B2 | 6/2013 | Keller et al. | |
| 8,471,267 B2 | 6/2013 | Hayashi et al. | |
| 8,476,125 B2 | 7/2013 | Khan et al. | |
| 8,492,779 B2 | 7/2013 | Lee | |
| 8,502,323 B2 | 8/2013 | Chen | |
| 8,519,438 B2 | 8/2013 | Mishra et al. | |
| 8,525,231 B2 | 9/2013 | Park et al. | |
| 8,558,584 B2 * | 10/2013 | Draxelmayr et al. | 327/108 |
| 8,598,937 B2 * | 12/2013 | Lal et al. | 327/427 |
| 8,603,880 B2 | 12/2013 | Yamada | |
| 8,614,460 B2 | 12/2013 | Matsushita | |
| 8,652,948 B2 | 2/2014 | Horie et al. | |
| 8,674,407 B2 | 3/2014 | Ando et al. | |
| 8,698,198 B2 | 4/2014 | Kuraguchi | |
| 8,716,141 B2 | 5/2014 | Dora et al. | |
| 8,772,832 B2 | 7/2014 | Boutros | |
| 2001/0032999 A1 | 10/2001 | Yoshida | |
| 2001/0040247 A1 | 11/2001 | Ando et al. | |
| 2002/0036287 A1 | 3/2002 | Yu et al. | |
| 2002/0121648 A1 | 9/2002 | Hsu et al. | |
| 2002/0153938 A1 * | 10/2002 | Baudelot et al. | 327/430 |
| 2002/0167023 A1 | 11/2002 | Chavarkar et al. | |
| 2003/0006437 A1 | 1/2003 | Mizuta et al. | |
| 2003/0020092 A1 | 1/2003 | Parikh et al. | |
| 2003/0030484 A1 | 2/2003 | Kang et al. | |
| 2004/0041169 A1 | 3/2004 | Ren et al. | |
| 2004/0061129 A1 | 4/2004 | Saxler et al. | |
| 2004/0119067 A1 | 6/2004 | Weeks, Jr. et al. | |
| 2004/0164347 A1 | 8/2004 | Zhao et al. | |
| 2005/0077541 A1 | 4/2005 | Shen et al. | |
| 2005/0133816 A1 | 6/2005 | Fan et al. | |
| 2005/0189561 A1 | 9/2005 | Kinzer et al. | |
| 2005/0189562 A1 | 9/2005 | Kinzer et al. | |
| 2005/0194612 A1 | 9/2005 | Beach | |
| 2005/0253168 A1 | 11/2005 | Wu et al. | |
| 2006/0011915 A1 | 1/2006 | Saito et al. | |
| 2006/0043499 A1 | 3/2006 | De Cremoux et al. | |
| 2006/0060871 A1 | 3/2006 | Beach | |
| 2006/0076677 A1 | 4/2006 | Daubenspeck et al. | |
| 2006/0102929 A1 | 5/2006 | Okamoto et al. | |
| 2006/0108602 A1 | 5/2006 | Tanimoto | |
| 2006/0108605 A1 | 5/2006 | Yanagihara et al. | |
| 2006/0121682 A1 | 6/2006 | Saxler | |
| 2006/0124962 A1 | 6/2006 | Ueda et al. | |
| 2006/0145189 A1 | 7/2006 | Beach | |
| 2006/0157729 A1 | 7/2006 | Ueno et al. | |
| 2006/0186422 A1 | 8/2006 | Gaska et al. | |
| 2006/0189109 A1 | 8/2006 | Fitzgerald | |
| 2006/0202272 A1 | 9/2006 | Wu et al. | |
| 2006/0220063 A1 | 10/2006 | Kurachi et al. | |
| 2006/0226442 A1 | 10/2006 | Zhang et al. | |
| 2006/0255364 A1 | 11/2006 | Saxler et al. | |
| 2006/0289901 A1 | 12/2006 | Sheppard et al. | |
| 2007/0007547 A1 | 1/2007 | Beach | |
| 2007/0018187 A1 | 1/2007 | Lee et al. | |
| 2007/0018199 A1 | 1/2007 | Sheppard et al. | |
| 2007/0018210 A1 | 1/2007 | Sheppard | |
| 2007/0045670 A1 | 3/2007 | Kuraguchi | |
| 2007/0080672 A1 | 4/2007 | Yang | |
| 2007/0128743 A1 | 6/2007 | Huang et al. | |
| 2007/0131968 A1 | 6/2007 | Morita et al. | |
| 2007/0132037 A1 | 6/2007 | Hoshi et al. | |
| 2007/0134834 A1 | 6/2007 | Lee et al. | |
| 2007/0145390 A1 | 6/2007 | Kuraguchi | |
| 2007/0145417 A1 | 6/2007 | Brar et al. | |
| 2007/0158692 A1 | 7/2007 | Nakayama et al. | |
| 2007/0164315 A1 | 7/2007 | Smith et al. | |
| 2007/0164322 A1 | 7/2007 | Smith et al. | |
| 2007/0194354 A1 | 8/2007 | Wu et al. | |
| 2007/0205433 A1 | 9/2007 | Parikh et al. | |
| 2007/0210329 A1 | 9/2007 | Goto | |
| 2007/0215899 A1 | 9/2007 | Herman | |
| 2007/0218598 A1 | 9/2007 | Niimi et al. | |
| 2007/0224710 A1 | 9/2007 | Palacios et al. | |
| 2007/0228477 A1 | 10/2007 | Suzuki et al. | |
| 2007/0241368 A1 | 10/2007 | Mil'shtein et al. | |
| 2007/0249119 A1 | 10/2007 | Saito | |
| 2007/0278518 A1 | 12/2007 | Chen et al. | |
| 2007/0295985 A1 | 12/2007 | Weeks, Jr. et al. | |
| 2008/0073670 A1 | 3/2008 | Yang et al. | |
| 2008/0093626 A1 | 4/2008 | Kuraguchi | |
| 2008/0111144 A1 | 5/2008 | Fichtenbaum et al. | |
| 2008/0121876 A1 | 5/2008 | Otsuka et al. | |
| 2008/0157121 A1 | 7/2008 | Ohki | |
| 2008/0203430 A1 | 8/2008 | Simin et al. | |
| 2008/0230784 A1 | 9/2008 | Murphy | |
| 2008/0237606 A1 | 10/2008 | Kikkawa et al. | |
| 2008/0237640 A1 | 10/2008 | Mishra et al. | |
| 2008/0272397 A1 | 11/2008 | Koudymov et al. | |
| 2008/0274574 A1 | 11/2008 | Yun | |
| 2008/0283844 A1 | 11/2008 | Hoshi et al. | |
| 2008/0308813 A1 | 12/2008 | Suh et al. | |
| 2009/0032820 A1 | 2/2009 | Chen | |
| 2009/0032879 A1 | 2/2009 | Kuraguchi | |
| 2009/0045438 A1 | 2/2009 | Inoue et al. | |
| 2009/0050936 A1 | 2/2009 | Oka | |
| 2009/0065810 A1 | 3/2009 | Honea et al. | |
| 2009/0072240 A1 | 3/2009 | Suh et al. | |
| 2009/0072269 A1 | 3/2009 | Suh et al. | |
| 2009/0072272 A1 | 3/2009 | Suh et al. | |
| 2009/0075455 A1 | 3/2009 | Mishra | |
| 2009/0085065 A1 | 4/2009 | Mishra et al. | |
| 2009/0140262 A1 | 6/2009 | Ohki et al. | |
| 2009/0146185 A1 | 6/2009 | Suh et al. | |
| 2009/0201072 A1 | 8/2009 | Honea et al. | |
| 2010/0065923 A1 | 3/2010 | Charles et al. | |
| 2010/0067275 A1 | 3/2010 | Wang et al. | |
| 2010/0117095 A1 | 5/2010 | Zhang | |

(56) References Cited

U.S. PATENT DOCUMENTS

| | | |
|---|---|---|
| 2010/0133506 A1 | 6/2010 | Nakanishi et al. |
| 2010/0203234 A1 | 8/2010 | Anderson et al. |
| 2010/0219445 A1 | 9/2010 | Yokoyama et al. |
| 2010/0264461 A1 | 10/2010 | Rajan et al. |
| 2011/0006346 A1 | 1/2011 | Ando et al. |
| 2011/0012110 A1 | 1/2011 | Sazawa et al. |
| 2012/0217512 A1 | 8/2012 | Renaud |
| 2012/0267637 A1 | 10/2012 | Jeon et al. |
| 2013/0056744 A1 | 3/2013 | Mishra et al. |
| 2013/0088280 A1 | 4/2013 | Lal et al. |
| 2013/0328061 A1 | 12/2013 | Chu et al. |
| 2014/0084346 A1 | 3/2014 | Tajiri |
| 2014/0094010 A1 | 4/2014 | Lal et al. |

FOREIGN PATENT DOCUMENTS

| | | |
|---|---|---|
| CN | 101312207 | 11/2008 |
| CN | 101897029 | 11/2010 |
| CN | 102017160 | 4/2011 |
| CN | 103477543 | 12/2013 |
| CN | 103493206 | 1/2014 |
| EP | 0 470 850 | 2/1992 |
| EP | 1 998 376 | 12/2008 |
| EP | 2 188 842 | 5/2010 |
| EP | 2 256 799 | 12/2010 |
| JP | 11-224950 | 8/1999 |
| JP | 2000-058871 | 2/2000 |
| JP | 2003-229566 | 8/2003 |
| JP | 2003-244943 | 8/2003 |
| JP | 2004-260114 | 9/2004 |
| JP | 2006-032749 | 2/2006 |
| JP | 2006-033723 | 2/2006 |
| JP | 2007-036218 | 2/2007 |
| JP | 2007-215331 | 8/2007 |
| JP | 2008-199771 | 8/2008 |
| JP | 2010-087076 | 4/2010 |
| JP | 2010-525023 | 7/2010 |
| JP | 2010-539712 | 12/2010 |
| KR | 10-2011-0033584 | 3/2011 |
| TW | 200924068 | 6/2009 |
| TW | 200924201 | 6/2009 |
| TW | 200947703 | 11/2009 |
| TW | 201010076 | 3/2010 |
| TW | 201027759 | 7/2010 |
| TW | 201027912 | 7/2010 |
| TW | 201036155 | 10/2010 |
| TW | 201322443 | 6/2013 |
| WO | WO 2004/070791 | 8/2004 |
| WO | WO 2004/098060 | 11/2004 |
| WO | WO 2005/036749 | 4/2005 |
| WO | WO 2005/070007 | 8/2005 |
| WO | WO 2005/070009 | 8/2005 |
| WO | WO 2006/114883 | 11/2006 |
| WO | WO 2007/077666 | 7/2007 |
| WO | WO 2007/108404 | 9/2007 |
| WO | WO 2008/120094 | 10/2008 |
| WO | WO 2009/036181 | 3/2009 |
| WO | WO 2009/036266 | 3/2009 |
| WO | WO 2009/039028 | 3/2009 |
| WO | WO 2009/039041 | 3/2009 |
| WO | WO 2009/076076 | 6/2009 |
| WO | WO 2009/132039 | 10/2009 |
| WO | WO 2010/039463 | 4/2010 |
| WO | WO 2010/068554 | 6/2010 |
| WO | WO 2010/090885 | 8/2010 |
| WO | WO 2010/132587 | 11/2010 |
| WO | WO 2011/031431 | 3/2011 |
| WO | WO 2011/072027 | 6/2011 |
| WO | WO 2013/052833 | 4/2013 |

OTHER PUBLICATIONS

Authorized officer Yolaine Cussac, International Preliminary Report on Patentability in PCT/US2008/076030, Mar. 25, 2010, 5 pages.
Authorized officer Chung Keun Lee, International Search Report and Written Opinion in PCT/US2008/076079, mailed Mar. 20, 2009, 11 pages.
Authorized officer Nora Lindner, International Preliminary Report on Patentability in PCT/US2008/076079, mailed Apr. 1, 2010, 6 pages.
Authorized officer Keon Hyeong Kim, International Search Report and Written Opinion in PCT/US2008/076160 mailed Mar. 18, 2009, 11 pages.
Authorized officer Simin Baharlou, International Preliminary Report on Patentability in PCT/US2008/076160, mailed Mar. 25, 2010, 6 pages.
Authorized officer Chung Keun Lee, International Search Report and Written Opinion in PCT/US2008/076199, mailed Mar. 24, 2009, 11 pages.
Authorized officer Dorothée Mülhausen, International Preliminary Report on Patentability in PCT/US2008/076199, mailed Apr. 1, 2010, 6 pages.
Authorized officer Keon Hyeong Kim, International Search Report and Written Opinion in PCT/US2008/085031, mailed Jun. 24, 2009, 11 pages.
Authorized officer Yolaine Cussac, International Preliminary Report on Patentability in PCT/US2008/085031, mailed Jun. 24, 2010, 6 pages.
Authorized officer Tae Hoon Kim, International Search Report and Written Opinion in PCT/US2009/041304, mailed Dec. 18, 2009, 13 pages.
Authorized officer Dorothée Mülhausen, International Preliminary Report on Patentability, in PCT/US2009/041304, mailed Nov. 4, 2010, 8 pages.
Authorized officer Sung Hee Kim, International Search Report and the Written Opinion in PCT/US2009/057554, mailed May 10, 2010, 13 pages.
Authorized Officer Gijsbertus Beijer, International Preliminary Report on Patentability in PCT/US2009/057554, mailed Mar. 29, 2011, 7 pages.
Authorized officer Cheon Whan Cho, International Search Report and Written Opinion in PCT/US2009/066647, mailed Jul. 1, 2010, 16 pages.
Authorized officer Athina Nikitas-Etienne, International Preliminary Report on Patentability in PCT/US2009/066647, mailed Jun. 23, 2011, 12 pages.
Authorized officer Sung Chan Chung, International Search Report and Written Opinion for PCT/US2010/021824, mailed Aug. 23, 2010, 9 pages.
Authorized officer Beate Giffo-Schmitt, International Preliminary Report on Patentability in PCT/US2010/021824, mailed Aug. 18, 2011, 6 pages.
Authorized officer Sang Ho Lee, International Search Report and Written Opinion in PCT/US2010/034579, mailed Dec. 24, 2010, 9 pages.
Authorized officer Nora Lindner, International Preliminary Report on Patentability in PCT/US2010/034579, mailed Nov. 24, 2011, 7 pages.
Authorized officer Jeongmin Choi, International Search Report and Written Opinion in PCT/US2010/046193, mailed Apr. 26, 2011, 13 pages.
Authorized officer Philippe Bëcamel, International Preliminary Report on Patentability in PCT/US2010/046193, mailed Mar. 8, 2012, 10 pages.
Authorized officer Sang Ho Lee, International Search Report and Written Opinion in PCT/US2010/059486, mailed Jul. 26, 2011, 9 pages.
Authorized officer Nora Lindner, International Preliminary Report on Patentability in PCT/US2010/059486, mailed Jun. 21, 2012, 6 pages.
Authorized officer Sang Won Choi, International Search Report and Written Opinion in PCT/US2012/059007, mailed Mar. 26, 2013, 10 pages.
Authorized officer Lingfei Bai, International Preliminary Report on Patentability in PCT/US2012/059007, mailed Apr. 17, 2014, 7 pages.
Chinese First Office Action for Application No. 200880120050.6, Aug. 2, 2011, 10 pages.

(56) References Cited

OTHER PUBLICATIONS

Ando et al., "10-W/mm AlGaN—GaN HFET with a Field Modulating Plate," IEEE Electron Device Letters, 2003, 24(5):289-291.

Arulkumaran et al. "Surface Passivation Effects on AlGaN/GaN High-Electron-Mobility Transistors with $SiO_2$, $Si_3N_4$, and Silicon Oxynitride," Applied Physics Letters, 2004, 84(4):613-615.

Coffie, "Characterizing and Suppressing DC-to-RF Dispersion in AlGaN/GaN High Electron Mobility Transistors," 2003, PhD Thesis, University of California, Santa Barbara, 169 pages.

Coffie et al., "Unpassivated p-GaN/AlGaN/GaN HEMTs with 7.1 W/mm at 10 GhZ," Electronic Letters, 2003, 39(19):1419-1420.

Chu et al., "1200-V Normally Off GaN-on-Si Field-effect Transistors with Low Dynamic On-Resistance," IEEE Electron Device Letters, 2011, 32(5):632-634.

Dora et al., "High Breakdown Voltage Achieved on AlGaN/GaN HEMTs with Integrated Slant Field Plates," IEEE Electron Device Letters, 2006, 27(9):713-715.

Dora et al., "$ZrO_2$ Gate Dielectrics Produced by Ultraviolet Ozone Oxidation for GaN and AlGaN/GaN Transistors," J. Vac. Sci. Technol. B, 2006, 24(2)575-581.

Dora, "Understanding Material and Process Limits for High Breakdown Voltage AlGaN/GaN HEMTs," PhD Thesis, University of California, Santa Barbara, Mar. 2006, 157 pages.

Fanciulli et al., "Structural and Electrical Properties of $HfO_2$ Films Grown by Atomic Layer Deposition on Si, Ge, GaAs and GaN," Mat. Res. Soc. Symp. Proc., 2004, vol. 786, 6 pages.

Green et al., "The Effect of Surface Passivation on the Microwave Characteristics of Undoped AlGaN/GaN HEMT's," IEEE Electron Device Letters, 2000, 21(6):268 270.

Gu et al., "AlGaN/GaN MOS Transistors using Crystalline $ZrO_2$ as Gate Dielectric," Proceedings of SPIE, 2007, vol. 6473, 64730S-1-8.

Higashiwaki et al. "AlGaN/GaN Heterostructure Field-Effect Transistors on 4H—SiC Substrates with Current-Gain Cutoff Frequency of 190 GHz," Applied Physics Express, 2008, 021103-1-3.

Hwang et al., "Effects of a Molecular Beam Epitaxy Grown AlN Passivation Layer on AlGaN/GaN Heterojunction Field Effect Transistors," Solid-State Electronics, 2004, 48:363-366.

Im et al., "Normally Off GaN MOSFET Based on AlGaN/GaN Heterostructure with Extremely High 2DEG Density Grown on Silicon Substrate," IEEE Electron Device Letters, 2010, 31(3):192-194.

Karmalkar and Mishra, "Enhancement of Breakdown Voltage in AlGaN/GaN High Electron Mobility Transistors Using a Field Plate," IEEE Transactions on Electron Devices, 2001, 48(8):1515-1521.

Karmalkar and Mishra, "Very High Voltage AlGaN/GaN High Electron Mobility Transistors Using a Field Plate Deposited on a Stepped Insulator," Solid-State Electronics, 2001, 45:1645-1652.

Keller et al., "GaN-GaN Junctions with Ultrathin AlN Interlayers: Expanding Heterojunction Design," Applied Physics Letters, 2002, 80(23):4387-4389.

Keller et al., "Method for Heteroepitaxial Growth of High Quality N-Face GaN, InN and AlN and their Alloys by Metal Organic Chemical Vapor Deposition," U.S. Appl. No. 60/866,035, filed Nov. 15, 2006, 31 pages.

Khan et al., "AlGaN/GaN Metal Oxide Semiconductor Heterostructure Field Effect Transistor," IEEE Electron Device Letters, 2000, 21(2):63-65.

Kim, "Process Development and Device Characteristics of AlGaN/GaN HEMTs for High Frequency Applications," PhD Thesis, University of Illinois at Urbana-Champaign, 2007, 120 pages.

Kumar et al., "High Transconductance Enhancement-mode AlGaN/GaN HEMTs on SiC Substrate," Electronics Letters, 2003, 39(24):1758-1760.

Kuraguchi et al., "Normally-off GaN-MISFET with Well-controlled Threshold Voltage," Phys. Stats. Sol., 2007, 204(6):2010-2013.

Lanford et al., "Recessed-gate Enhancement-mode GaN HEMT with High Threshold Voltage," Electronic Letters, 2005, 41(7):449-450.

Lee et al., "Self-aligned Process for Emitter- and Base-regrowth GaN HBTs and BJTs," Solid-State Electronics, 2001, 45:243-247.

Mishra et al., "AlGaN/GaN HEMTs—An Overview of Device Operation and Applications," Proceedings of the IEEE, 2002, 90(6):1022-1031.

Nanjo et al., "Remarkable Breakdown Voltage Enhancement in AlGaN Channel High Electron Mobility Transistors," Applied Physics Letters 92 (2008), 3 pages.

Ohmaki et al., "Enhancement-mode AlGaN/AlN/GaN High Electron Mobility Transistor with Low On-state Resistance and High Breakdown Voltage," Japanese Journal of Applied Physics, 2006, 45(44):L1168-L1170.

Ota and Nozawa, "AlGaN/GaN Recessed MIS-gate HFET with High-threshold-voltage Normally-off Operation for Power Electronics Applications," IEEE Electron Device Letters, 2008, 29(7):668-670.

Palacios et al., "AlGaN/GaN HEMTs with an InGaN-based Back-barrier," Device Research Conference Digest, 2005, DRC '05 63rd, pp. 181-182.

Palacios et al., "AlGaN/GaN High Electron Mobility Transistors with InGaN Back-Barriers," IEEE Electron Device Letters, 2006, 27(1):13-15.

Palacios et al., "Nitride-based High Electron Mobility Transistors with a GaN Spacer," Applied Physics Letters, 2006, 89:073508-1-3.

Pei et al., "Effect of Dielectric Thickness on Power Performance of AlGaN/GaN HEMTs," IEEE Electron Device Letters, 2009, 30(4):313-315.

"Planar, Low Switching Loss, Gallium Nitride Devices for Power Conversion Applications," SBIR N121-090 (Navy), 2012, 3 pages.

Rajan et al., "Advanced Transistor Structures Based on N-face GaN," 32M International Symposium on Compound Semiconductors (ISCS), Sep. 18-22, 2005, Europa-Park Rust, Germany, 2 pages.

Saito et al., "Recessed-gate Structure Approach Toward Normally Off High-voltage AlGaN/GaN HEMT for Power Electronics Applications," IEEE Transactions on Electron Device, 2006, 53(2):356-362.

Shelton et al., "Selective Area Growth and Characterization of AlGaN/GaN Heterojunction Bipolar Transistors by Metalorganic Chemical Vapor Deposition," IEEE Transactions on Electron Devices, 2001, 48(3):490-494.

Shen, "Advanced Polarization-based Design of AlGaN/GaN HEMTs," Jun. 2004, PhD Thesis, University of California, Santa Barbara, 192 pages.

Sugiura et al., "Enhancement-mode n-channel GaN MOSFETs Fabricated on p-GaN Using $HfO_2$ as Gate Oxide," Electronics Letters, 2007, vol. 43, No. 17, 2 pages.

Suh et al. "High-Breakdown Enhancement-mode AlGaN/GaN HEMTs with Integrated Slant Field-Plate," Electron Devices Meeting, 2006, IEDM '06 International, 3 pages.

Tipirneni et al. "Silicon Dioxide-encapsulated High-Voltage AlGaN/GaN HFETs for Power-Switching Applications," IEEE Electron Device Letters, 2007, 28(9):784-786.

Vetury et al., "Direct Measurement of Gate Depletion in High Breakdown (405V) Al/GaN/GaN Heterostructure Field Effect Transistors," IEDM 98, 1998, pp. 55-58.

Wang et al., "Comparison of the Effect of Gate Dielectric Layer on 2DEG Carrier Concentration in Strained AlGaN/GaN Heterostructure," Mater. Res. Soc. Symp. Proc., 2007, vol. 831, 6 pages.

Wang et al., "Demonstration of Submicron Depletion-mode GaAs MOSFET's with Negligible Drain Current Drift and Hysteresis," IEEE Electron Device Letters, 1999, 20(9):457-569.

Wang et al , "Enhancement-mode $Si_3N_4$/AlGaN/GaN MISHFETs," IEEE Electron Device Letters, 2006, 27(10):793-795.

Wu, "AlGaN/GaN Microwave Power High-Mobility Transistors," PhD Thesis, University of California, Santa Barbara, Jul. 1997, 134 pages.

Wu et al., "A 97.8% Efficient GaN HEMT Boost Converter with 300-W Output Power at 1MHz,"Electronic Device Letters, 2008, IEEE, 29(8):824-826.

Yoshida, "AlGan/GaN Power FET," Furukawa Review, 2002, 21:7-11.

Zhang, "High Voltage GaN HEMTs with Low On-resistance for Switching Applications," PhD Thesis, University of California, Santa Barbara, Sep. 2002, 166 pages.

(56) References Cited

OTHER PUBLICATIONS

Arulkumaran et al , "Enhancement of Breakdown Voltage by AlN Buffer Layer Thickness in AlGaN/GaN High-electron-mobility Transistors on 4 in. Diameter Silicon," Applied Physics Letters, 2005, 86:123503-1-3.

Barnett and Shinn, "Plastic and Elastic Properties of Compositionally Modulated Thin Films," Annu. Rev. Mater. Sci., 1994, 24:481-511.

Chen et al., "High-performance AlGaN/GaN Lateral Field-effect Rectifiers Compatible with High Electron Mobility Transistors," Applied Physics Letters, 2008, 92, 253501-1-3.

Cheng et al., "Flat GaN Epitaxial Layers Grown on Si(111) by Metalorganic Vapor Phase Epitaxy Using Step-graded AlGaN Intermediate Layers," Journal of Electronic Materials, 2006, 35(4):592-598.

Marchand et al., "Metalorganic Chemical Vapor Deposition on GaN on Si(111): Stress Control and Application to Filed-effect Transistors," Journal of Applied Physics, 2001, 89(12):7846-7851.

Mishra et al., "Growing N-polar III-nitride structures," U.S. Appl. No. 60/972,467, filed Sep. 14, 2007, 7 pages.

Mishra et al., "N-face High Electron Mobility Transistors with Low Buffer Leakage and Low Parasitic Resistance," U.S. Appl. No. 60/908,914, filed Mar. 29, 2007, 21 pages.

Mishra et al., "Polarization-induced Barriers for N-face Nitride-based Electronics," U.S. Appl. No. 60/940,052, filed May 24, 2007, 29 pages.

Napierala et al., "Selective GaN Epitaxy on Si(111) Substrates Using Porous Aluminum Oxide Buffer Layers," Journal of the Electrochemical Society, 2006. 153(2):G125-G127, 4 pages.

Palacios et al., "Fluorine Treatment to Shape the Electric Field in Electron Devices, Passivate Dislocations and Point Defects, and Enhance the Luminescence Efficiency of Optical Devices," U.S. Appl. No. 60/736,628, filed Nov. 15, 2005, 21 pages.

Reiher et al., "Efficient Stress Relief in GaN Heteroepitaxy on Si(111) Using Low-temperature AlN Interlayers," Journal of Crystal Growth, 2003, 248:563-567.

Suh et al., "III-Nitride Devices with Recessed Gates," U.S. Appl. No. 60/972,481, filed Sep. 14, 2007, 18 pages.

Zhanghong Content, Shanghai Institute of Metallurgy, Chinese Academy of Sciences, "Two-Dimensional Electron Gas and High Electron Mobility Transistor (HEMT)," Dec. 31, 1984, 17 pages.

Authorized officer Kwan Sik Sul, International Search Report and Written Opinion in PCT/US2011/063975, mailed May 18, 2012, 8 pages.

Authorized officer Simin Baharlou, International Preliminary Report on Patentability in PCT/US2011/063975, mailed Jun. 27, 2013, 5 pages.

Authorized officer Sang-Taek Kim, International Search Report and Written Opinion in PCT/US2011/061407, mailed May 22, 2012, 10 pages.

Authorized officer Lingfei Bai, International Preliminary Report on Patentability in PCT/US2011/061407, mailed Jun. 6, 2013, 7 pages.

Authorized officer Kwan Sik Sul, International Search Report and Written Opinion in PCT/US2012/023160, mailed May 24, 2012, 9 pages.

Authorized officer Simin Baharlou, International Preliminary Report on Patentability in PCT/US2012/023160, mailed Aug. 15, 2013, 6 pages.

Authorized officer Jeongmin Choi, International Search Report and Written Opinion in PCT/US2012/027146, mailed Sep. 24, 2012, 12 pages.

Authorized officer Athina Nickitas-Etienne, International Preliminary Report on Patentability in PCT/US2012/027146, mailed Sep. 19, 2013, 9 pages.

Authorized officer Tae Hoon Kim, International Search Report and Written Opinion in PCT/US2013/035837, mailed Jul. 30, 2013, 9 pages.

Authorized officer Hye Lyun Park, International Search Report and Written Opinion in PCT/US2013/050914, mailed Oct. 18, 2013, 11 pages.

Authorized officer Jun. Young Son, International Search Report and Written Opinion in PCT/US2014/016298, mailed May 23, 2014, 15 pages.

Authorized officer Sang Won Choi, International Search Report and Written Opinion in PCT/US2013/024470, mailed May 27, 2013, 12 pages.

Authorized officer Simin Baharlou, International Preliminary Report on Patentability in PCT/US2013/024470, mailed Aug. 14, 2014, 9 pages.

Authorized officer June Young Son, International Search Report and Written Opinion in PCT/US2014/024191, mailed Aug. 7, 2014, 11 pages.

Chinese First Office Action for Application No. 200980114639.X, May 14, 2012, 13 pages.

European Search Report in Application No. 10 81 5813.0, mailed Mar. 12, 2013, 9 pages.

Search Report and Action in TW Application No. 098132132, issued Dec. 6, 2012, 8 pages.

Authorized officer Sang Won Choi, International Search Report and Written Opinion in PCT/US2013/048275, mailed Oct. 14, 2013, 17 pages.

Authorized officer Tae Hoon Kim, International Search Report and Written Opinion in PCT/US2014/027523, mailed Jul. 30, 2014, 14 pages.

Search Report and Action in TW Application No. 098141930, issued Jul. 10, 2014, 7 pages.

Authorized officer Agnès Wittmann-Regis, International Preliminary Report on Patentability in PCT/US2013/035837, mailed Oct. 23, 2014, 6 pages.

Authorized officer Yukari Nakamura International Preliminary Report on Patentability in PCT/US2013/050914, mailed Jan. 29, 2015, 8 pages.

European Search Report in Application No. EP 12 83 8540.8, mailed Apr. 24, 2015, 3 pages.

Communications pursuant to Article 94(3) EPC in Application No. EP 12 83 8540.8, mailed May 7, 2015, 10 pages.

* cited by examiner

METHOD OF FORMING ELECTRONIC COMPONENTS WITH INCREASED RELIABILITY

CROSS-REFERENCE TO RELATED APPLICATIONS

This is a divisional application of U.S. application Ser. No. 14/068,944, filed Oct. 31, 2013 (now U.S. Pat. No. 8,860, 495), which is a continuation application of U.S. application Ser. No. 13/269,367, filed Oct. 7, 2011 (now U.S. Pat. No. 8,598,937). The disclosures of the prior applications are considered part of and are incorporated by reference in the disclosure of this application.

TECHNICAL FIELD

This invention relates to semiconductor electronic devices designed to achieve increased reliability.

BACKGROUND

To date, most transistors used in power electronic applications have typically been fabricated with silicon (Si) semiconductor materials. Common transistor devices for power applications include Si CoolMOS, Si Power MOSFETs, and Si Insulated Gate Bipolar Transistors (IGBTs). While Si power devices are inexpensive, they suffer from a number of disadvantages, including relatively low switching speeds and high levels of electrical noise. More recently, silicon carbide (SiC) power devices have been considered due to their superior properties. III-N semiconductor devices, such as gallium nitride (GaN) devices, are now emerging as attractive candidates to carry large currents, support high voltages and to provide very low on-resistance and fast switching times.

Most conventional III-N high electron mobility transistors (HEMTs) and related transistor devices are normally on, i.e., have a negative threshold voltage, which means that they can conduct current at zero gate voltage. These devices with negative threshold voltages are known as depletion-mode (D-mode) devices. It is preferable in power electronics to have normally off devices, i.e., devices with positive threshold voltages, that do not conduct substantial current at zero gate voltage, in order to avoid damage to the device or to other circuit components by preventing accidental turn on of the device. Normally off devices are commonly referred to as enhancement-mode (E-mode) devices.

Reliable fabrication and manufacturing of high-voltage III-N E-mode transistors has thus far proven to be very difficult. One alternative to a single high-voltage E-mode transistor is to combine a high-voltage D-mode transistor with a low-voltage E-mode transistor in the configuration of FIG. 1 to form a hybrid device, which can be operated in the same way as a single high-voltage E-mode transistor and in many cases achieves the same or similar output characteristics as a single high-voltage E-mode transistor, shown in FIG. 2. The hybrid device of FIG. 1 includes a high-voltage D-mode transistor 23 and a low-voltage E-mode transistor 22 which optionally can both be encased in a package 10, the package including a source lead 11, a gate lead 12, and a drain lead 13. The source electrode 31 of the low-voltage E-mode transistor 22 and the gate electrode 35 of the high-voltage D-mode transistor 23 are both electrically connected together and can be electrically connected to the source lead 11. The gate electrode 32 of the low-voltage E-mode transistor 22 can be electrically connected to the gate lead 12. The drain electrode 36 of the high-voltage D-mode transistor 23 can be electrically connected to the drain lead 13. The source electrode 34 of the high-voltage D-mode transistor 23 is electrically connected to the drain electrode 33 of the low-voltage E-mode transistor 22.

As used herein, two or more contacts or other items such as conductive layers or components are said to be "electrically connected" if they are connected by a material which is sufficiently conducting to ensure that the electric potential at each of the contacts or other items is substantially the same or about the same regardless of bias conditions.

The device of FIG. 2 includes a single high-voltage E-mode transistor 21 which can be encased in the same or a similar package to the hybrid device of FIG. 1. The source electrode 41 of the high-voltage E-mode transistor 21 can be connected to the source lead 11, the gate electrode 42 of the high-voltage E-mode transistor 21 can be connected to the gate lead 12, and the drain electrode 43 of the high-voltage E-mode transistor 21 can be connected to the drain lead 13. The device in FIG. 1 and the device in FIG. 2 are both capable of blocking high voltages between the source lead 11 and drain lead 13 when 0V is applied to the gate lead 12 relative to the source lead 11, and both can conduct current from the drain lead 13 to the source lead 11 when a sufficiently positive voltage is applied to the gate lead 12 relative to the source lead 11.

While there are many applications in which the hybrid device of FIG. 1 can be used in place of the single high-voltage E-mode device of FIG. 2, acceptable levels of reliability for hybrid devices such as that of FIG. 1 have been difficult to obtain. Improvements in device design which lead to higher levels of reliability are thus desirable.

SUMMARY

In one aspect, an electronic component is described. The electronic component includes: an enhancement-mode transistor having a first breakdown voltage, the enhancement-mode transistor comprising a first source, a first gate, and a first drain; a depletion-mode transistor having a second breakdown voltage which is larger than the first breakdown voltage, the depletion-mode transistor comprising a second source, a second gate, and a second drain; and a resistor comprising a first terminal and a second terminal. The second terminal and the second source are electrically connected to the first drain, and the first terminal is electrically connected to the first source.

The electronic component can optionally include one or more of the following features. The second gate can be electrically connected to the first source. The enhancement-mode transistor can be a low voltage device, and the depletion-mode transistor can be a high-voltage device. The second breakdown voltage can be at least three times the first breakdown voltage. The enhancement-mode transistor or the depletion-mode transistor can be a III-N device. The enhancement-mode transistor can be a silicon-based transistor, and the depletion-mode transistor can be a III-N transistor. The enhancement-mode transistor can have a threshold voltage, and a resistance of the resistor can be sufficiently small to reduce, compared to an electronic component lacking the resistor, a voltage of the first drain relative to the first source when the electronic component is biased such that a voltage of the first gate relative to the first source is less than the threshold voltage of the enhancement-mode transistor and a voltage of the second drain relative to the first source is greater than the first breakdown voltage and less than the second breakdown voltage. The enhancement-mode transistor can have a threshold voltage; wherein, when the electronic component is biased such that a voltage of the first gate relative to the first source is less than the threshold voltage of the enhancement-mode transistor and a voltage of the second drain relative to the first source is greater than the first breakdown voltage and less than the second breakdown voltage, a first off-state leakage current flows through the depletion-mode transistor, and a second off-state leakage current which is smaller than the first off-state leakage current flows through the enhancement-mode transistor; and at a first temperature, a resistance of the resistor is less than the first breakdown voltage divided by a difference between the second off-state leakage current and the first off-state leakage current. The enhancement-mode transistor can have a threshold voltage; wherein, when the electronic component is biased such that a voltage of the first gate relative to the first source is less than the threshold voltage of the enhancement-mode transistor and a voltage of the second drain relative to the first source is greater than the first breakdown voltage and less than the second breakdown voltage, a first off-state leakage current flows through the second source of the depletion-mode transistor, and a second off-state leakage current which is smaller than the first off-state leakage current flows through the first drain of the enhancement-mode transistor; and at a first temperature, a resistance of the resistor is less than the first breakdown voltage divided by a difference between the second off-state leakage current and the first off-state leakage current. The first temperature can be 25° C. The voltage of the first gate relative to the first source can be 0V. The electronic component can be rated to operate at a temperature range between and including a second temperature and a third temperature, the second temperature being less than the first temperature and the third temperature being greater than the first temperature, wherein the resistance of the resistor is less than the first breakdown voltage divided by the difference between the second off-state leakage current and the first off-state leakage current at all temperatures within the temperature range. The second temperature can −55° C. and the third temperature can be 200° C. The enhancement-mode transistor can have a first threshold voltage and the depletion-mode transistor can have a second threshold voltage; wherein, when the electronic component is biased such that a voltage of the first gate relative to the first source is less than the threshold voltage of the enhancement-mode transistor and a voltage of the second drain relative to the first source is greater than the first breakdown voltage and less than the second breakdown voltage, an off-state leakage current flows through the second source of the depletion-mode transistor; and at a first temperature, a resistance of the resistor is sufficiently large to prevent the off-state leakage current from exceeding a critical value. The first temperature can be 25° C. The voltage of the first gate relative to the first source can be 0V. The critical value can be a value of off-state leakage current in the depletion-mode transistor during operation of the electronic component which results in fluctuations of over 10V in the second threshold voltage. The electronic component can be rated to operate at a temperature range between and including a second temperature and a third temperature, the second temperature being less than the first temperature and the third temperature being greater than the first temperature, and the critical value being a function of temperature, wherein the resistance of the resistor is sufficiently large to prevent the off-state leakage current from exceeding the critical value at all temperatures within the temperature range. The second temperature can be −55° C. and the third temperature can be 200° C. The enhancement-mode transistor can have a first threshold voltage and the depletion-mode transistor can have a second threshold voltage; wherein a resistance of the resistor is selected such that when the electronic component is biased such that a voltage of the first gate relative to the first source is less than the first threshold voltage and a voltage of the second drain relative to the first source is greater than the first breakdown voltage and less than the second breakdown voltage, at a temperature of 25° C. a difference between a voltage of the second gate relative to the second source and the second threshold voltage is less than 10V. The electronic component can be rated to operate at a temperature range between and including a first temperature and a second temperature, wherein the difference between the voltage of the second gate relative to the second source and the second threshold voltage is less than 5V at all temperatures within the temperature range. The first temperature can be −55° C. and the second temperature can be 200° C. An absolute value of a threshold voltage of the depletion-mode transistor can be smaller than the first breakdown voltage. The absolute value of the threshold voltage of the depletion-mode transistor can be about 10V or larger. The resistor can have a resistance between $10^3$ ohms and $10^9$ ohms. The electronic component can further include a diode having an anode and a cathode, wherein the anode is electrically connected to the first source or to the second gate, and the cathode is electrically connected to the first drain or to the second source. The diode and the depletion-mode transistor can be integrated into a single device. The single device can be a III-N device.

In another aspect, an electronic component is described. The electronic component includes an enhancement-mode transistor having a first threshold voltage and a first breakdown voltage, the enhancement-mode transistor comprising a first source, a first gate, and a first drain; and a depletion-mode transistor having a second breakdown voltage which is larger than the first breakdown voltage, the depletion-mode transistor having a second threshold voltage, the depletion-mode transistor comprising a second source, a second gate, and a second drain, the second source being electrically connected to the first drain. At a first temperature, an off-state drain current of the enhancement-mode transistor under a first bias condition is greater than an off-state source current of the depletion-mode transistor under a second bias condition; wherein under the first bias condition, a first voltage of the first gate relative to the first source is less than the first threshold voltage, and a second voltage of the second drain relative to the first source is greater than the first breakdown voltage and less than the second breakdown voltage; and under the second bias condition, a third voltage of the second gate relative to the second source is less than the second threshold voltage, and a fourth voltage of the second drain relative to the second gate is equal to the second voltage.

The electronic component can optionally include one or more of the following features. Under the first bias condition, the first voltage can be less than or equal to 0V. Under the second bias condition, an absolute value of the third voltage is less than the first breakdown voltage. The first temperature can be 25° C. The electronic component can be rated to operate at a temperature range between and including a second temperature and a third temperature, wherein the second temperature is less than the first temperature and the third temperature is greater than the second temperature, and the off-state drain current of the enhancement-mode transistor under the first bias condition is greater than the off-state source current of the depletion-mode transistor under the second bias condition at all temperatures within the temperature range. The second temperature can be −55° C. and the third temperature can be 200° C. The off-state source current of the depletion-mode transistor under the second bias condition can be less than 0.75 times the off-state drain current of the enhancement-mode transistor under the first bias condition. At a second temperature, the off-state drain current of the enhancement-mode transistor under a third bias condition is less than the off-state source current of the depletion-mode transistor under the second bias condition, wherein under the third bias condition, the first voltage is less than the first threshold voltage, and a fifth voltage of the first drain relative to the first source is less than the first breakdown voltage. Under the third bias condition, the first voltage is less than or equal to 0V. The second temperature can be less than the first temperature. The electronic component can further include a current-carrying component having a first terminal and a second terminal, wherein the first terminal is electrically connected to the first source or to the second gate, and the second terminal is electrically connected to the first drain or to the second source. The current-carrying component can be a resistor or a diode. The current-carrying component can comprise a resistor and a diode. The second gate can be electrically connected to the first source. The enhancement-mode transistor can be a low voltage device, and the depletion-mode transistor can be a high-voltage device. The second breakdown voltage can be at least three times the first breakdown voltage. The enhancement-mode transistor or the depletion-mode transistor can be a III-N device. The enhancement-mode transistor can be a silicon-based transistor, and the depletion-mode transistor can be a III-N transistor. The depletion-mode transistor can be a III-N transistor comprising a III-N buffer structure, a III-N channel layer, and a III-N barrier layer, wherein the buffer structure can be doped with iron, magnesium, or carbon. A first layer of the III-N buffer structure can be at least 0.8 microns thick and can be doped with Fe and C, the concentration of Fe being at least $8\times10^{17}$ cm$^{-3}$ and the concentration of C being at least $8\times10^{19}$ cm$^{-3}$.

In another aspect, an electronic component is described. The electronic component includes an enhancement-mode transistor having a first breakdown voltage and a first threshold voltage, the enhancement-mode transistor comprising a first source, a first gate, and a first drain; a depletion-mode transistor having a second breakdown voltage which is larger than the first breakdown voltage, the depletion-mode transistor having a second threshold voltage, the depletion-mode transistor comprising a second source, a second gate, and a second drain; and a current-carrying component comprising a first terminal and a second terminal, the second terminal and the second source being electrically connected to the first drain, and the first terminal being electrically connected to the first source. The current-carrying component is configured to reduce, compared to an electronic component lacking the current-carrying component, a voltage of the first drain relative to the first source when the electronic component is biased such that a voltage of the first gate relative to the first source is less than the first threshold voltage and a voltage of the second drain relative to the first source is greater than the first breakdown voltage and less than the second breakdown voltage.

The electronic component can optionally include one or more of the following features. The voltage of the first gate relative to the first source can be 0V or less. The current-carrying component can be a diode. The first terminal can be an anode and the second terminal can be a cathode. The first terminal can be a cathode and the second terminal can be an anode. A turn-on voltage or a Zener breakdown voltage of the diode can be less the first breakdown voltage. At a first temperature, a current flowing through the diode can be greater than an off-state current flowing through the first drain of the enhancement-mode transistor when the electronic component is biased such that the voltage of the first gate relative to the first source is less than the first threshold voltage and the voltage of the second drain relative to the first source is greater than the first breakdown voltage and less than the second breakdown voltage. The first temperature can be between $-55°$ C. and 200° C. The diode can have a turn-on voltage which is greater than 0V, and the depletion-mode transistor can have a threshold voltage which is less than 0V, wherein the turn-on voltage or a Zener breakdown voltage of the diode is greater than an absolute value of the threshold voltage of the depletion-mode transistor. The diode and the depletion-mode transistor can be integrated into a single device. The diode and the depletion-mode transistor can each comprise a conductive channel, wherein the single device comprises a channel region which is shared between the conductive channels of the diode and the depletion-mode transistor. The electronic component can further comprise a resistor having a first resistor terminal and a second resistor terminal, wherein the first resistor terminal is electrically connected to the first source or to the second gate, and the second resistor terminal is electrically connected to the first drain or to the second source. A channel of the diode and a channel of the depletion-mode transistor can be in a first semiconductor material layer. The electronic component can further comprise a resistor having a first resistor terminal and a second resistor terminal, wherein the first resistor terminal is electrically connected to the first source or to the second gate, and the second resistor terminal is electrically connected to the first drain or to the second source. The second gate can be electrically connected to the first source. The enhancement-mode transistor can be a low voltage device, and the depletion-mode transistor can be a high-voltage device. The enhancement-mode transistor or the depletion-mode transistor can be a III-N device. The enhancement-mode transistor can be a silicon-based transistor, and the depletion-mode transistor can be a III-N transistor. The current-carrying component can be a resistor. The resistor can have a resistance between $10^3$ ohms and $10^9$ ohms. At a first temperature, a current flowing through the resistor can be greater than an off-state current flowing through the drain of the enhancement-mode transistor when the electronic component is biased such that the voltage of the first gate relative to the first source is less than the first threshold voltage and the voltage of the second drain relative to the first source is greater than the first breakdown voltage and less than the second breakdown voltage. The first temperature can be between $-55°$ C. and 200° C. The current-carrying component can comprise an additional transistor having a source, a gate, and a drain, wherein the gate of the additional transistor is electrically connected to the source or the drain of the additional transistor. The additional transistor can be an enhancement-mode transistor. The current-carrying component can comprise a first resistor having a first and second terminal and an additional transistor having a source, a gate, and a drain, wherein the first terminal of the first resistor is the first terminal of the current-carrying component, and the drain of the additional transistor is the second terminal of the current-carrying component. The second terminal of the first resistor can be electrically connected to the gate of the additional transistor. The electronic component can further comprise a second resistor having a first and second terminal, wherein the first terminal of the second resistor is electrically connected to the source of the additional transistor, and the second terminal of the second resistor is electrically connected to the gate of the additional transistor. The current-carrying component can comprise a first resistor having a first and second terminal and an additional transistor having a source, a gate, and a drain, wherein the first terminal of the first resistor is the second terminal of the current-carrying component, and the source of the additional transistor is the first terminal of the current-carrying component. The second terminal of the first resistor can be electrically connected to the gate of the additional transistor. The electronic component can further comprise a second resistor having a first and second terminal, wherein the first terminal of the second resistor is electrically connected to the drain of the additional transistor, and the second terminal of the second resistor is electrically connected to the gate of the additional transistor.

In another aspect, a method of producing an electronic component is described. The method comprises: connecting a first terminal of a current-carrying component to a first source of an enhancement-mode transistor, the enhancement mode transistor having a first breakdown voltage and a first threshold voltage, the enhancement-mode transistor comprising the first source, a first gate, and a first drain; and connecting a second terminal of the current-carrying component to the first drain and a second source of a depletion-mode transistor, the depletion-mode transistor having a second breakdown voltage which is larger than the first breakdown voltage, the depletion-mode transistor having a second threshold voltage, the depletion-mode transistor comprising the second source, a second gate, and a second drain. The current-carrying component is configured to reduce, compared to an electronic component lacking the current-carrying component, a voltage of the first drain relative to the first source when the electronic component is biased such that a voltage of the first gate relative to the first source is less than the first threshold voltage and a voltage of the second drain relative to the first source is greater than the first breakdown voltage and less than the second breakdown voltage.

The method can optionally include one or more of the following features. The method can further comprise encasing the electronic component into a package, including connecting the second drain to a package drain terminal, connecting the first source to a package source terminal, and connecting the first gate to a package gate terminal. The method can further comprise connecting the second gate to the first source. The current-carrying component can be a diode. At a first temperature, a current flowing through the diode can be greater than an off-state current flowing through the first drain of the enhancement-mode transistor when the electronic component is biased such that the voltage of the first gate relative to the first source is less than the first threshold voltage and the voltage of the second drain relative to the first source is greater than the first breakdown voltage and less than the second breakdown voltage. The enhancement-mode transistor can be a silicon-based transistor, and the depletion-mode transistor can be a III-N transistor. The current-carrying component can be a resistor.

Devices and methods described herein can increase the reliability of high power semiconductor electronic devices.

DESCRIPTION OF DRAWINGS

Like reference symbols in the various drawings indicate like elements.

DETAILED DESCRIPTION

Figure 2:
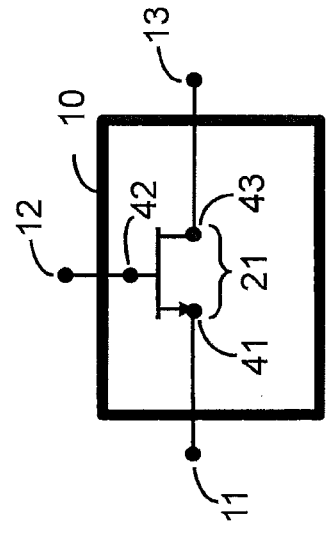
FIGS. 1 and 2 are schematic diagrams of electronic components of the prior art.

Described herein are hybrid enhancement-mode electronic components which include a depletion-mode transistor and an enhancement mode transistor. The depletion-mode transistor, which can be a high-voltage device, has a larger breakdown voltage than the enhancement-mode transistor, which can be a low-voltage device. The maximum voltage that can be blocked by the hybrid electronic components when they are biased in the off state is at least as large as the maximum blocking or breakdown voltage of the depletion-mode transistor. The hybrid electronic components described herein are configured such that reliability and/or performance are improved as compared to conventional hybrid devices. Some implementations include a resistor connected in parallel to the enhancement-mode transistor, while other implementations include a diode connected in parallel to the enhancement-mode transistor. In yet other implementations, the depletion-mode transistor is designed or configured to have a lower off-state leakage current than that of the enhancement-mode transistor, as is further described below.

As used herein, a "hybrid enhancement-mode electronic device or component", or simply a "hybrid device or component", is an electronic device or component formed of a depletion-mode transistor and an enhancement-mode transistor, where the depletion-mode transistor is capable of a higher operating and/or breakdown voltage as compared to the enhancement-mode transistor, and the hybrid device or component is configured to operate similarly to a single enhancement-mode transistor with a breakdown and/or operating voltage about as high as that of the depletion-mode transistor. That is, a hybrid enhancement-mode device or component includes at least 3 nodes having the following properties. When the first node (source node) and second node (gate node) are held at the same voltage, the hybrid enhancement-mode device or component can block a positive high voltage (i.e., a voltage larger than the maximum voltage that the enhancement-mode transistor is capable of blocking) applied to the third node (drain node) relative to the source node. When the gate node is held at a sufficiently positive voltage (i.e., greater than the threshold voltage of the enhancement-mode transistor) relative to the source node, current passes from the source node to the drain node or from the drain node to the source node when a sufficiently positive voltage is applied to the drain node relative to the source node. When the enhancement-mode transistor is a low-voltage device and the depletion-mode transistor is a high-voltage device, the hybrid component can operate similarly to a single high-voltage enhancement-mode transistor. The depletion-mode transistor can have a breakdown and/or maximum operating voltage that is at least two times, at least three times, at least five times, at least ten times, or at least twenty times that of the enhancement-mode transistor.

As used herein, a "high-voltage device", such as a high-voltage transistor, is an electronic device which is optimized for high-voltage switching applications. That is, when the transistor is off, it is capable of blocking high voltages, such as about 300V or higher, about 600V or higher, about 1200V or higher, or about 1700V or higher, and when the transistor is on, it has a sufficiently low on-resistance ($R_{ON}$) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300V, 600V, 1200V, 1700V, or other suitable blocking voltage required by the application. In other words, a high-voltage device can block any voltage between 0V and at least $V_{max}$, where $V_{max}$ is the maximum voltage that could be supplied by the circuit or power supply. In some implementations, a high-voltage device can block any voltage between 0V and at least $2*V_{max}$. As used herein, a "low-voltage device", such as a low-voltage transistor, is an electronic device which is capable of blocking low voltages, such as between 0V and $V_{low}$ (where $V_{low}$ is less than $V_{max}$), but is not capable of blocking voltages higher than $V_{low}$. In some implementations, $V_{low}$ is equal to about $|V_{th}|$, greater than $|V_{th}|$, about $2*|V_{th}|$, about $3*|V_{th}|$, or between about $|V_{th}|$ and $3*|V_{th}|$, where $|V_{th}|$ is the absolute value of the threshold voltage of a high-voltage transistor, such as a high-voltage-depletion mode transistor, contained within the hybrid component in which a low-voltage transistor is used. In other implementations, $V_{low}$ is about 10V, about 20V, about 30V, about 40V, or between about 5V and 50V, such as between about 10V and 40V. In yet other implementations, $V_{low}$ is less than about $0.5*V_{max}$, less than about $0.3*V_{max}$, less than about $0.1*V_{max}$, less than about $0.05*V_{max}$, or less than about $0.02*V_{max}$.

In typical power switching applications in which high-voltage switching transistors are used, the transistor is during the majority of time in one of two states. In the first state, which is commonly referred to as the "on state", the voltage at the gate electrode relative to the source electrode is higher than the transistor threshold voltage, and substantial current flows through the transistor. In this state, the voltage difference between the source and drain is typically low, usually no more than a few volts, such as about 0.1-5 volts. In the second state, which is commonly referred to as the "off state", the voltage at the gate electrode relative to the source electrode is lower than the transistor threshold voltage, and no substantial current, apart from off-state leakage current, flows through the transistor. In this second state, the voltage between the source and drain can range anywhere from about 0V to the value of the circuit high voltage supply, which in some cases can be as high as 100V, 300V, 600V, 1200V, 1700V, or higher, but can be less than the breakdown voltage of the transistor. In some applications, inductive elements in the circuit cause the voltage between the source and drain to be even higher than the circuit high voltage supply. Additionally, there are short times immediately after the gate has been switched on or off during which the transistor is in a transition mode between the two states described above. When the transistor is in the off state, it is said to be "blocking a voltage" between the source and drain. As used herein, "blocking a voltage" refers to the ability of a transistor, device, or component to prevent significant current, such as current that is greater than 0.001 times the average operating current during regular on-state conduction, from flowing through the transistor, device, or component when a voltage is applied across the transistor, device, or component. In other words, while a transistor, device, or component is blocking a voltage that is applied across it, the total current passing through the transistor, device, or component will not be greater than 0.001 times the average operating current during regular on-state conduction.

Figure 1:
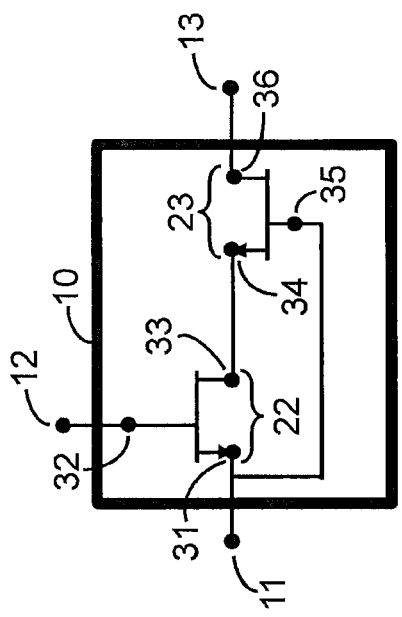

When the hybrid enhancement-mode device of FIG. 1 is used in place of a conventional high-voltage E-mode transistor as in FIG. 2, the hybrid device operates as follows. When the hybrid device is in the on state, current flows through both the channel of the E-mode transistor and the channel of the D-mode transistor, and the voltage across each of the two transistors can be small, typically a few volts or less. When the hybrid device is in the off state, the voltage blocked by the hybrid device is divided between the E-mode transistor and the D-mode transistor. The E-mode transistor blocks a voltage approximately between $|V_{th,D}|$ and $V_{br,E}$, where $|V_{th,D}|$ is the absolute value of the threshold voltage of the D-mode transistor, and $V_{br,E}$ is the breakdown voltage of the E-mode transistor. The remainder of the voltage across the hybrid device is blocked by the high-voltage D-mode transistor.

The voltage across the E-mode transistor when the hybrid device is in the off state depends partially on the levels of off-state leakage current in the E-mode and D-mode transistors. While ideal transistors conduct no current when biased in the off-state, real transistors can conduct small off-state leakage currents, typically much smaller than the currents passing through the transistors when they are biased in the on-state. The off-state leakage current of a transistor is the current flowing through the drain or through the source of the transistor when it is blocking a certain voltage. In the absence of gate leakage and/or other charge trapping effects, the off-state source leakage and off-state drain leakage are substantially the same, and substantially all off-state leakage current flows between the drain and the source of the transistor. In the presence of gate leakage and/or other trapping effects, while most off-state leakage current typically flows between the drain and the source, some off-state leakage current may flow between the gate and drain or between the gate and source, and so the leakage currents through the source and drain may differ. However, in many cases the source and drain leakage currents do not vary too much from one another. For example, the off-state drain leakage current of the E-mode transistor 22 is the current flowing through its drain 33 when it is blocking a voltage, and the off-state source leakage current of the E-mode transistor 22 is the current flowing through its source 31 when it is blocking a voltage. The off-state drain leakage current of the D-mode transistor 23 is the current flowing through its drain 36 when it is blocking a voltage, and the off-state source leakage current of the D-mode transistor 23 is the current flowing through its source 64 when it is blocking a voltage. The off-state leakage currents of a device can depend on the gate voltage, the source voltage, and the drain voltage applied to the device.

In the hybrid device of FIG. 1, the off-state leakage currents through the hybrid device (e.g., between the terminals 11 and 13, through terminal 11, or through terminal 13 of the hybrid device) conduct through both the E-mode transistor 22 and the D-mode transistor 23. Since the drain of transistor 22 is connected to the source of transistor 23, the off-state drain leakage current of transistor 22 is typically about the same as the off-state source leakage current of transistor 23. If one of the transistors 22 and 23 is configured such that it conducts more off-state leakage current than the other when it is independently biased off with a source-drain voltage less than the transistor breakdown voltage, the bias on the other transistor adjusts such that the other transistor conducts about the same off-state leakage current.

In conventional hybrid devices, such as that shown in FIG. 1, the off-state leakage current depends on both the D-mode transistor 23 and the E-mode 22 transistor, with the transistor driving higher off-state leakage current driving the overall off-state leakage current. The D-mode transistor can in many cases contribute to a higher off-state leakage current through the hybrid device than the E-mode device.

For example, suppose that the D-mode transistor, isolated from the E-mode transistor, conducts a first off-state source leakage current when blocking a voltage smaller than $V_{br,D}$, and the E-mode transistor, isolated from the D-mode transistor, conducts a second off-state drain leakage current when blocking a voltage smaller than $V_{br,E}$. In conventional hybrid devices, the transistors are configured so that the first source leakage current (the leakage current through the source of the D-mode transistor) is greater than the second drain leakage current (the leakage current through the drain of the E-mode transistor.) Consequently, when the E-mode transistor 22 and the D-mode transistor 23 are combined in the hybrid device, the D-mode transistor 23 drives the off-state leakage current of the hybrid device. That is, the off-state drain leakage current of the hybrid device is approximately equal to the first off-state drain leakage current.

In the case where the D-mode transistor 23 drives the off-state drain leakage current of the hybrid device, the voltage at the drain 33 of the E-mode transistor 22 during off-state operation of the hybrid device typically adjusts so that the drain-source voltage of the E-mode transistor is approximately equal to $V_{br,E}$. In this case, the E-mode transistor 22 is biased at breakdown, and the drain current that flows through the E-mode transistor 22 during off-state operation of the hybrid device is approximately equal to the off-state source current of the D-mode transistor.

In cases where the off-state source leakage current in the D-mode transistor at threshold $V_{th,D}$ of the D-mode transistor is somewhat greater (i.e., only slightly greater) than the off-state drain leakage current of the E-mode transistor, further reducing the gate-source voltage of the D-mode transistor below $V_{th,D}$ but maintaining it above $-V_{br,E}$ can result in the off-state drain leakage current of the E-mode transistor being the same as the off-state source leakage current of the D-mode transistor. In those cases, the voltage at the drain 33 of the E-mode transistor 22 adjusts so that the drain-source voltage of the E-mode transistor is between $V_{br,E}$ and $|V_{th,D}|$ but is typically closer to $V_{br,E}$. The drain-source voltage of the E-mode transistor is the same or about the same as the source-gate voltage of the D-mode transistor because the source 32 of the E-mode transistor is electrically connected to the gate 35 of the D-mode transistor.

Figure 3:
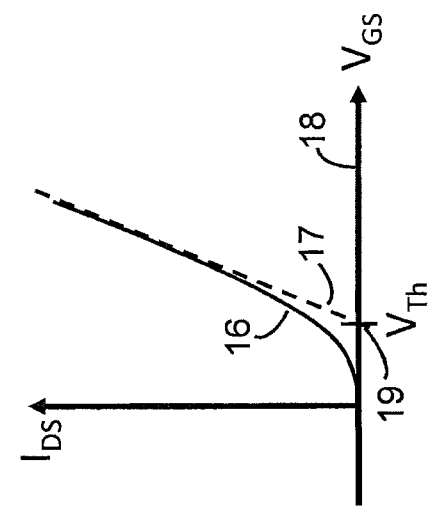
FIG. 3 is a representative plot of drain-source current versus gate-source voltage in a transistor, along with an extrapolation of the transistor threshold voltage.

The threshold voltage of a transistor can be determined using the relationship between the gate voltage of a transistor, $V_{GS}$, and the current through the transistor, $I_{DS}$. FIG. 3 shows an example plot between the gate voltage $V_{GS}$ and the drain-source current $I_{DS}$ of an E-mode transistor. The voltage at the drain relative to the source $V_{DS}$ is held constant at a voltage substantially larger than the knee voltage but less than the breakdown voltage of the transistor, for example at 0.1, 0.25, or 0.5 times the transistor breakdown voltage. The voltage at the gate relative to the source $V_{GS}$ is then swept from below threshold to above threshold, and the drain current $I_{DS}$ is plotted versus $V_{GS}$, the current and voltage axes both being on a linear scale.

As seen in FIG. 3, the threshold voltage is determined by a linear extrapolation 17 of the plot 16 to the voltage axis in the portion of the plot where the current has risen substantially above its sub-threshold value. The point 19 on the voltage axis 18 at which the linear extrapolation 17 intersects the voltage axis 18 is the threshold voltage of the transistor. For a D-mode transistor, the relationship is similar; however, the threshold voltage is less than zero (to the left of the vertical axis in FIG. 3.) The transistor is biased into the off-state by driving $V_{GS}$ to a negative voltage.

Reliability and/or performance of hybrid devices can degrade during device operation if the gate-source voltage $V_{GS,D}$ of the D-mode transistor drops too far below the threshold voltage $V_{th,D}$ of the D-mode transistor, or when the E-mode transistor is biased at its breakdown voltage $V_{br,E}$ during off-state operation of the hybrid device. Specifically, if a high-voltage III-N HEMT transistor is used for the D-mode device, the threshold voltage of the III-N HEMT can fluctuate during operation of the hybrid device for hybrid designs in which the gate-source voltage of the D-mode transistor drops too far below the threshold voltage of the D-mode transistor. Significant fluctuations in the threshold voltage of the D-mode transistor, such as greater than 3V, greater than 5V, greater than 8V, or greater than 10V, can result in an unacceptably high degradation in device reliability and/or performance. Off-state operation of the D-mode transistor at gate-source voltages further below (i.e., more negative than) $V_{th,D}$ can result in higher threshold voltage fluctuations. Furthermore, operation of the E-mode transistor at its breakdown voltage $V_{br,E}$ can decrease the useful lifetime of the E-mode transistor.

As used herein, the terms III-Nitride or III-N materials, layers, devices, structures, etc., refer to a material, layer, device, or structure comprised of a compound semiconductor material according to the stoichiometric formula $Al_xIn_yGa_zN$, where x+y+z is about 1. In a III-Nitride or III-N device, such as a transistor or HEMT, the conductive channel can be partially or entirely contained within a III-N material layer.

Figure 4A:
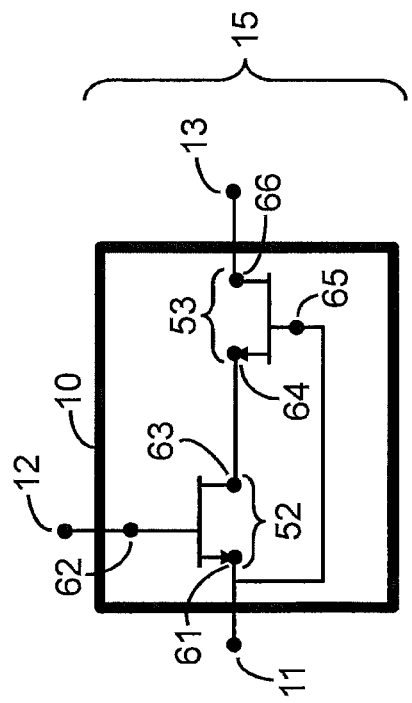
FIG. 4A is a circuit schematic of a hybrid electronic component.

FIG. 4A is a circuit schematic of a hybrid device 15 that can exhibit improved reliability and/or performance. The hybrid device 15 includes a D-mode transistor 53 that is formed or configured differently than the D-mode transistor 23 of FIG. 1. The hybrid device 15 is configured to prevent the voltage at the source 64 relative to the gate 65 of the D-mode transistor 53 from rising too high above $|V_{th,D}|$ during off-state operation, as described below.

The D-mode transistor 53 and an E-mode transistor 52 can optionally be encased in a package 10, the package including a source lead 11, a gate lead 12, and a drain lead 13. The D-mode transistor 53 has a larger breakdown and/or operating voltage, for example at least three times, at least six times, at least ten times, or at least twenty times the breakdown and/or operating voltage, as compared to the E-mode transistor 52. The D-mode transistor 53 can be a high-voltage transistor, and the E-mode transistor 52 can be a low-voltage transistor. The threshold voltage $V_{th,E}$ of the E-mode transistor 52 is greater than 0V, for example greater than 1V, greater than 1.5V, or greater than 2V, and the threshold voltage $V_{th,D}$ of the D-mode transistor 53 is less than 0V, for example less than −2V, less than −8V, less than −15V, less than −20V, or less than −24V. In some cases, D-mode transistors with lower (i.e., more negative) threshold voltages are easier to fabricate reliably. The breakdown voltage of the E-mode transistor 52 is greater than $|V_{th,D}|$. The source electrode 61 of the E-mode transistor 52 and the gate electrode 65 of the D-mode transistor 53 are both electrically connected together and can be electrically connected to the source lead 11. The gate electrode 62 of the E-mode transistor 52 can be electrically connected to the gate lead 12. The drain electrode 66 of the D-mode transistor 53 can be electrically connected to the drain lead 13. The source electrode 64 of the D-mode transistor 53 is electrically connected to the drain electrode 63 of the E-mode transistor 52.

The hybrid device 15 of FIG. 4A is configured such that the off-state drain leakage current of the hybrid device is driven by the E-mode transistor 52, e.g., at least at one temperature. For example, the D-mode transistor 53 can be doped to exhibit smaller off-state source leakage currents than the D-mode transistor 23 of FIG. 1. Thus, depending on the selection of the E-mode transistor 52, the D-mode transistor (in a different application) can conduct a smaller off-state source leakage current than the drain leakage current conducted by the E-mode transistor 52 (also in a different application) so that, consequently, the off-state drain leakage current of the hybrid device 15 is driven by the E-mode transistor rather than the D-mode transistor.

This relationship between the leakage currents of the E-mode and D-mode transistors can be expressed by considering two bias conditions of the hybrid device 15. The E-mode and D-mode transistors can be configured so that at least at one temperature, for example at room temperature (25° C.), the off-state leakage current that flows through the E-mode transistor 52, i.e., through the drain 63 of the E-mode transistor 52, when the hybrid device is biased under a first bias condition is greater than the off-state leakage current that flows through the D-mode transistor 53, i.e., through the source 64 of the D-mode transistor, when the hybrid device is biased under a second bias condition.

Under the first bias condition, the voltage of the gate 62 relative to the source 61, $V_{GS,E}$, of the E-mode transistor 52 is less than the threshold voltage $V_{th,E}$ of the E-mode transistor 52, such as at least 1V or at least 2V below $V_{th,E}$, or at or below 0V, and the voltage of the drain 66 of the D-mode transistor 53 relative to the source 61 of the E-mode transistor 52 is greater than $V_{br,E}$ and less than the breakdown voltage $V_{br,D}$ of the D-mode transistor 53. Under the second bias condition, the voltage of the gate 65 relative to the source 64 of the D-mode transistor 53, $V_{GS,D}$, is less than or equal to $V_{th,D}$, such as at least 2V below $V_{th,D}$ or between $V_{th,D}$ and $-V_{br,E}$, and the voltage of the drain 66 relative to the gate 65 of the D-mode transistor 53 is equal to the voltage of the drain 66 of the D-mode transistor 53 relative to the source 61 of the E-mode transistor 52 applied under the first bias condition. In other words, at least at one temperature, the off-state current that flows through both the drain of the E-mode transistor 52 and the source of the D-mode transistor 53 during conventional off-state operation of the hybrid device 15 is greater than the off-state current that flows through the source of the D-mode transistor 53 when the D-mode transistor 53 is operated independently in the off state.

When the relationships for the off-state currents of the E-mode transistor 52 and D-mode transistor 53 described above are satisfied, the hybrid device 15 functions in the off-state as follows. When the voltage applied to the gate 62 relative to the source 61 of the E-mode transistor 52 is less than the threshold voltage $V_{th,E}$ of the E-mode transistor 52, for example the applied voltage is about 0V or less, and the voltage applied to the drain 66 of the D-mode transistor 53 relative to the source 61 of the E-mode transistor 52 is less than the breakdown voltage of the D-mode transistor 53, the hybrid device blocks a voltage, with only a small off-state leakage current passing through both the D-mode and E-mode transistors. Because the D-mode transistor 53 and E-mode transistor 52 are connected in series, the voltage at the drain 63 of the E-mode transistor 52 (or equivalently at the source 64 of the D-mode transistor 53) adjusts such that the off-state current passing through the E-mode transistor 52, i.e., through the drain 63 of the E-mode transistor, and through the D-mode transistor 53, i.e., through the source 64 of the D-mode transistor, is the same or about the same.

Since the off-state current of the E-mode transistor 52 typically does not vary substantially with variations in drain-source voltage, at least within the range of variations typical of the hybrid device 15 of FIG. 4A, the voltage at the source 64 relative to the gate 65 of the D-mode transistor 53 adjusts to a value that is approximately equal to or close to $|V_{th,D}|$, such that the off-state current passing through the D-mode transistor 53 is larger than would typically be the case when the D-mode transistor 53 is independently biased in the off-state. Since the gate-source voltage of the D-mode transistor 53 is maintained close to or at about $V_{th,D}$ during off-state operation of the hybrid device 15, the hybrid device 15 may exhibit improved reliability and/or performance.

In some implementations, either the E-mode transistor 52 or the D-mode transistor 53, or both, is a III-N transistor, such as a III-N HEMT, HFET, MESFET, JFET, MISFET, POLFET, or CAVET. In other implementations, either the E-mode transistor 52 or the D-mode transistor 53, or both, is a silicon-based transistor, such as a silicon power MOSFET (i.e., the semiconductor materials in the device are primarily formed of Silicon).

In yet other implementations, the E-mode transistor is a silicon-based transistor, and the D-mode transistor is a III-N transistor. III-N transistors typically include a III-N channel layer, such as GaN, and a III-N barrier layer with a wider bandgap than the III-N channel layer, for example $Al_xGa_{1-x}N$ with $0<x\leq1$. A two-dimensional electron gas (2DEG) channel is induced in the channel layer near the interface between the channel layer and the barrier layer. Source and drain electrodes contact the 2DEG channel, and a gate electrode modulates the charge in the channel in a portion of the transistor between the source electrode and the drain electrode. In a III-Nitride or III-N device, the conductive channel can be partially or entirely contained within a III-N material layer.

Figure 4B:
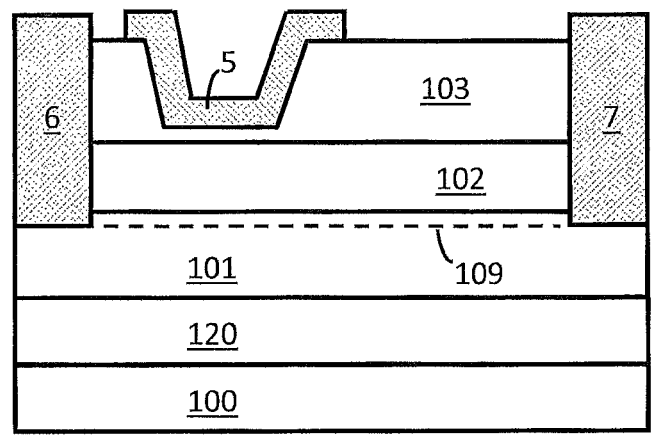
FIG. 4B is a cross-sectional view of a depletion-mode transistor.

For example, the D-mode transistor 53 of FIG. 4A can be the D-mode transistor shown in FIG. 4B. FIG. 4B shows a III-N D-mode transistor which includes a substrate 100, which for example can be formed of silicon or silicon-carbide, a III-N buffer structure 120, a III-N channel layer 101, which for example can be unintentionally doped or undoped GaN, a III-N barrier layer 102, which for example can be $Al_xGa_{1-x}N$ ($0<x\leq1$), a source 6, a gate 5, and a drain 7. A two-dimensional electron gas (2DEG) channel 109 is induced in the III-N channel layer 101 due to a compositional difference between the channel and barrier layers 101 and 102, respectively. The III-N buffer structure 120 includes one or more III-N layers. Source and/or drain leakage currents in the device typically flow through the buffer structure 120. In cases where the substrate 100 is floating (i.e., is not connected to any DC or AC voltage sources), leakage currents in the buffer structure 120 typically flow laterally, i.e., along the direction from the source to the drain. In cases which the electric potential of the substrate 100 is held fixed, leakage currents can additionally flow in a vertical direction, for example from the source 6 or drain 7 through the substrate 100.

The leakage currents in the D-mode transistor of FIG. 4B can be reduced to sufficiently low values for use in the hybrid component of FIG. 4A by adjusting the parameters of buffer structure 120. For example, doping layers in the buffer structure with iron (Fe) at a concentration of at least $1\times10^{18}$ cm$^{-3}$ or at least $5\times10^{18}$ cm$^{-3}$ can limit lateral leakage currents. Additionally, doping layers in the buffer structure with carbon (C) and/or magnesium (Mg) can limit vertical leakage currents as well as further reduce lateral leakage currents in the device. Furthermore, increasing the thickness of the buffer layers doped with Fe, C, and/or Mg can further reduce leakage currents in the device. In some implementations, a buffer structure which allows for sufficiently low leakage is at least 2 microns, at least 3 microns, or at least 5 microns thick, and includes a III-N layer which is at least 0.8 microns thick that is doped with both Fe and C, the concentration of Fe being at least $8 \times 10^{17}$ cm$^{-3}$ and the concentration of C being at least $8 \times 10^{19}$ cm$^{-3}$.

In some implementations, the E-mode transistor 52 and/or the D-mode transistor 53 is a nitrogen-face or N-face or N-polar III-N device. A nitrogen-face or N-face or N-polar III-N device can include III-N materials grown with an N-face or [0 0 0 1 bar] face furthest from the growth substrate, or can include source, gate, or drain electrodes on an N-face or [0 0 0 1 bar] face of the III-N materials. Alternatively, the E-mode transistor 52 and/or the D-mode transistor 53 could be a Ga-face or III-face or III-polar III-N device. A Ga-face or III-face or III-polar III-N device can include III-N materials grown with a group III-face or [0 0 0 1] face furthest from the growth substrate, or can include source, gate, or drain electrodes on a group III-face or [0 0 0 1] face of the III-N materials.

For various applications, the hybrid device 15 of FIG. 4A is configured or rated to operate at a range of temperatures, for example a range of −55° C. to 200° C. or −40° C. to 175° C. However, off-state currents in transistors often vary with temperature, typically increasing as temperature is increased. In some implementations, the relationships between the off-state currents of the D-mode and E-mode transistors specified above hold for all temperatures within the temperature range. For example, in some implementations the temperature range which the hybrid device is rated to operate at is fairly narrow or relatively high, for example greater than or equal to room temperature, in which case the relationships between the off-state currents of the D-mode and E-mode transistors of FIG. 4A specified above hold for all temperatures within the temperature range.

In other implementations, the relationships hold at least at a first temperature but do not hold at a second temperature. For example, at the second temperature, the off-state drain current of the E-mode transistor 52 under a third bias condition may be less than the off-state source current of the D-mode transistor 53 under the first or second bias condition, where under the third bias condition, $V_{GS,E}$ is less than $V_{th,E}$ (for example, $V_{GS,E}$ is less than or equal to 0V), and the voltage of the drain relative to the source $V_{DS,E}$ of the E-mode transistor is less than $V_{br,E}$. In other words, at the second temperature, the off-state current flowing through the source of the D-mode transistor 53 during normal off-state operation of the hybrid device 15 is greater than the off-state current that flows through the drain of the E-mode transistor 52 when the E-mode transistor is independently operated in the off-state with $V_{DS,E} < V_{br,E}$. When the hybrid device 15 is operated in the off-state at the second temperature, the voltage $V_{DS,E}$ across the E-mode transistor 52 is about equal to $V_{br,E}$ so that the off-state current passing through the drain of the E-mode transistor 52 is equal to or about equal to the off-state current passing through the source of the D-mode transistor 53. The first and second temperature may both be within the range of temperatures that the device is configured or rated to operate within. In some cases, the first temperature is greater than the second temperature, whereas in other cases the second temperature is greater than the first temperature.

For example, off-state leakage current in a silicon-based transistor typically increases as a function of temperature at a higher rate than in a III-N based transistor. Hence, when a silicon-based transistor is used for E-mode transistor 52 and a III-N transistor is used for D-mode transistor 53, the first temperature can be greater than the second temperature. Alternatively, when a III-N transistor is used for E-mode transistor 52 and a silicon-based transistor is used for D-mode transistor 53, the first temperature can be less than the second temperature. Or, if both transistors are III-N transistors, then whether the first temperature is greater than or less than the second temperature depends on the specific structure of each of the two transistors.

While in some applications normal operation of hybrid device 15 at a temperature where $V_{DS,E}$ is about equal to $V_{br,E}$ (or is much greater than $|V_{th,D}|$) in the off state can be sustained for short amounts of time, prolonged operation at such a temperature can result in poor reliability and/or performance, or possibly in device failure. Additional modifications to the hybrid device which prevent the drain-source voltage $V_{DS,E}$ of the E-mode transistor from exceeding $|V_{th,D}|$ too much can further improve reliability and/or performance of the hybrid device. Examples of such modifications are shown in FIGS. 5, 6, 10, and 11.

The hybrid electronic components 75, 85, 95, and 99 of FIGS. 5, 6, 10, and 11, respectively, each include a D-mode transistor 73 and an E-mode transistor 72 which optionally can both be encased in a package 10, the package including a source lead 11, a gate lead 12, and a drain lead 13. The D-mode transistor 73 has a larger breakdown voltage $V_{br,D}$ and/or operating voltage, for example at least three times or at least six times the breakdown and/or operating voltage, as compared to the breakdown voltage $V_{br,E}$ and/or operating voltage of the E-mode transistor 72. The D-mode transistor 73 can be a high-voltage transistor, and the E-mode transistor 72 can be a low-voltage transistor. The threshold voltage $V_{th,E}$ of the E-mode transistor 72 is greater than 0V, for example greater than 1V, greater than 1.5V, or greater than 2V, and the threshold voltage $V_{th,D}$ of the D-mode transistor 73 is less than 0V, for example less than −2V, less than −8V, less than −15V, less than −20V, or less than −24V. The breakdown voltage of the E-mode transistor 72 is greater than $|V_{th,D}|$. The source electrode 61 of the E-mode transistor 72 and the gate electrode 65 of the D-mode transistor 73 are both electrically connected together and can be electrically connected to the source lead 11. The gate electrode 62 of the E-mode transistor 72 can be electrically connected to the gate lead 12. The drain electrode 66 of the D-mode transistor 73 can be electrically connected to the drain lead 13. The source electrode 64 of the D-mode transistor 73 is electrically connected to the drain electrode 63 of the E-mode transistor 72.

The hybrid components 75, 85, 95, and 99 each also include a current-carrying device or component (herein a "current-carrying component") which includes two terminals, one of which is directly connected to the source 61 (that is, connected to the source without any intermediary layers, devices, or components between the terminal and the source) of the E-mode transistor 72, and the other of which is directly connected to the drain 63 of the E-mode transistor. The current-carrying component can, for example, be a resistor 74, as in FIG. 5, a diode 84, as in FIG. 6, or a combination of transistors, resistors, and/or diodes, as in FIGS. 10-11. The current-carrying component serves to reduce the drain-source voltage $V_{DS,E}$ across the E-mode transistor 72 (and therefore the absolute value of the gate-source voltage $|V_{GS,D}|$ of the D-mode transistor 73) when the hybrid component 75, 85, 95, or 99 is biased with $V_{GS,E} < V_{th,E}$ (for example, with $V_{GS,E} \leq 0V$) and is blocking a voltage that is between $V_{br,E}$ and $V_{br,D}$ at least at one temperature. That is, at least at one temperature, when the hybrid component 75, 85, 95, or 99 is biased in the off-state and blocks a voltage that is between $V_{br,E}$ and $V_{br,D}$, $V_{DS,E}$ is reduced as compared to a hybrid component which lacks the current-carrying component but is otherwise identical to the hybrid component 75, 85, 95, or 99.

Figure 5:
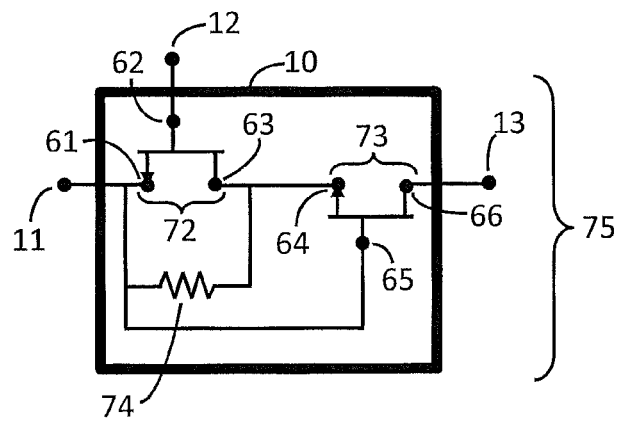
FIGS. 5-6 are circuit schematics of hybrid electronic components.

Referring to FIG. 5, hybrid component 75 operates in the off-state as follows. The total off-state source current through the D-mode transistor 73 is equal to or about equal to the sum of the off-state currents through the drain of the E-mode transistor 72 and through the resistor 74, and so the voltage $V_{DS,E}$ at the drain 63 of the E-mode transistor 72 relative to the source 61 of the E-mode transistor 72 adjusts to ensure that this condition is maintained. The off-state current $I_R$ through the resistor is given by $V_{DS,E}/R$, where R is the resistance of the resistor.

At some temperatures, the off-state drain current of the E-mode transistor 72 under a first bias condition may be greater than the off-state source current of the D-mode transistor 73 under a second bias condition, while at other temperatures the off-state drain current of the E-mode transistor 72 under a third bias condition may be less than the off-state source current of the D-mode transistor 73 under the second bias condition. Under the first bias condition, the gate-source voltage $V_{GS,E}$ of the E-mode transistor 72 is less than $V_{th,E}$, for example $V_{GS,E}$ can be 0V or less, and the voltage of the drain 66 of the D-mode transistor 73 relative to the source 61 of the E-mode transistor 72 is greater than $V_{br,E}$ and less than $V_{br,D}$. In other words, under the first bias condition, the hybrid component 75 is biased in the off-state and blocks a voltage between $V_{br,E}$ and $V_{br,D}$. Under the second bias condition, the voltage of the gate 65 relative to the source 64 of the D-mode transistor 73, $V_{GS,D}$, is less than or equal to $V_{th,D}$, such as at least 2V below $V_{th,D}$ or between $V_{th,D}$ and $-V_{br,E}$, and the voltage of the drain 66 relative to the gate 65 of the D-mode transistor 73 is equal to the voltage of the drain 66 of the D-mode transistor 73 relative to the source 61 of the E-mode transistor 72 applied under the first bias condition. Under the third bias condition, $V_{GS,E}$ is less than $V_{th,E}$, for example $V_{GS,E}$ can be 0V or less, and $V_{DS,E}$ is less than $V_{br,E}$.

During off-state operation of hybrid component 75 at temperatures where off-state source current of the E-mode transistor 72 under the first bias condition is greater than off-state drain current of D-mode transistor 73 under the second bias condition, $V_{DS,E}$ is close to (in some cases less than) $|V_{th,D}|$, and the current passing through the source of D-mode transistor 73 equals the sum of the off-state drain current of the E-mode transistor 72 and $I_R$. Hence, at such temperatures, the off-state current passing through the source of D-mode transistor 73 can be greater than the off-state current that would typically pass through the source of D-mode transistor 73 when D-mode transistor 73 is independently biased in the off-state with $V_{GS,D}<V_{th,D}$ and $V_{DS,D}<V_{br,D}$. As such, decreasing the value of R at such temperatures increases the off-state current through the source of the D-mode transistor 73 with little or no substantial decrease in $V_{DS,E}$. Since $V_{DS,E}$ remains close to $|V_{th,D}|$, threshold voltage fluctuations in the D-mode transistor 73 resulting from large values of $V_{DS,E}$ during operation are mitigated.

However, in some cases, large currents passing through the source of the D-mode transistor 73 when the gate-source voltage $V_{GS,D}$ of the D-mode transistor 73 is close to $V_{th,D}$ can also result in large threshold voltage fluctuations (for example, threshold voltage fluctuations of at least 2V, at least 3V, at least 5V, at least 8V, or at least 10V) in D-mode transistor 73 during operation of the hybrid component. The exact value of threshold voltage fluctuation that can be sustained without causing too much degradation in performance and/or reliability of the hybrid component may depend on the particular application in which the hybrid component is used. Hence, a resistor 74 with sufficiently large resistance can be chosen in order to prevent off-state leakage currents through the source of the D-mode transistor 73 from exceeding the value that results in excessively large threshold voltage fluctuations through the D-mode transistor 73.

During off-state operation at temperatures where the off-state drain current of the E-mode transistor 72 under the third bias condition is less than the off-state source current of the D-mode transistor 73 under the second bias condition, the exact value of $V_{DS,E}$ is determined at least in part by the resistance R of the resistor 74, as follows. The off-state current $I_{D,off}$ passing through the source of the D-mode transistor 73 equals the sum of the off-state current $I_{E,off}$ passing through the drain of the E-mode transistor 72 and $I_R$, where $I_R=V_{DS,E}/R$. The maximum off-state drain current $I_{E,max}$ that the E-mode transistor 72 can have when $V_{DS,E}$ is less than $V_{br,E}$ is equal to the off-state drain current of the E-mode transistor 72 under the third bias condition. If $I_{E,off}>I_{E,max}$, which occurs when $R \geq V_{br,E}/(I_{D,off}-I_{E,max})$, then the E-mode transistor 72 will be biased at breakdown, such that $V_{DS,E}=V_{br,E}$ in order for the E-mode transistor 72 to carry the current $I_{E,off}$. If $R<V_{br,E}/(I_{D,off}-I_{E,max})$, or $R<V_{br,E}/(I_{D,off}-I_{E,off})$, then $V_{DS,E}$ is less than $V_{br,E}$ which can improve the reliability of the hybrid component 75. Reliability can, in some cases, be further improved by further reducing the resistance, thereby further reducing $V_{DS,E}$ and $|V_{GS,D}|$.

For example, the resistance can be selected such that at 25° C. or at all operating temperatures, the difference between $V_{GS,D}$ and $V_{th,D}$ is less than 10V, such as less than 5V or 3V. However, reducing $V_{DS,E}$ also increases (i.e., makes less negative) the gate-source voltage of the D-mode transistor 73, which results in an increase in $I_{D,off}$. As in the case of operation at temperatures where off-state drain current of the E-mode transistor 72 under the first bias condition is greater than the off-state source current of D-mode transistor 73 under the second bias condition, large off-state currents passing through the source of the D-mode transistor 73 can also result in large threshold voltage fluctuations (for example, threshold voltage fluctuations of at least 2V, at least 3V, at least 5V, at least 8V, or at least 10V) in D-mode transistor 73 during operation of the hybrid component, thereby degrading reliability. Hence, a resistor 74 with sufficiently large resistance can be chosen in order to prevent off-state source leakage currents through the D-mode transistor 73 from exceeding the value that results in excessively large threshold voltage fluctuations through the D-mode transistor 73. The resistor 74 can, for example, have a resistance between $10^2$ ohms and $10^{10}$ ohms, such as between $10^3$ ohms and $10^9$ ohms or between $10^4$ ohms and $10^8$ ohms. In some implementations, the resistance of the resistor 74 varies with temperature, for example increasing as temperature is increased.

All off-state current in excess of the maximum amount that can be carried through the drain of E-mode transistor 72 with $V_{DS,E}<V_{br,E}$ flows through the resistor 74. In some cases, at least at one temperature, the total off-state current that flows through the source of the D-mode transistor 73 is much greater than the maximum off-state current that can be carried through the drain of the E-mode transistor 72 with $V_{DS,E}<V_{br,E}$ for example at least 2 times, at least 5 times, at least 10 times, at least 50 times, or at least 100 times greater. At such temperatures, the current that flows through the resistor 74 is greater than the off-state current flowing through the drain of the E-mode transistor 72.

In some implementations, either the E-mode transistor 72 or the D-mode transistor 73, or both, is a III-N transistor, such as a III-N HEMT, HFET, MESFET, JFET, MISFET, POLFET, or CAVET. In other implementations, either the E-mode transistor 72 or the D-mode transistor 73, or both, is a silicon-based transistor, such as a silicon power MOSFET (i.e., the semiconductor materials in the device are primarily formed of Silicon).

In yet other implementations, the E-mode transistor 72 is a silicon-based transistor, and the D-mode transistor 73 is a III-N transistor. The E-mode transistor 72 and/or the D-mode transistor 73 can be a nitrogen-face or N-face or N-polar III-N device. A nitrogen-face or N-face or N-polar III-N device can include III-N materials grown with an N-face or [0 0 0 1 bar] face furthest from the growth substrate, or can include source, gate, or drain electrodes on an N-face or [0 0 0 1 bar] face of the III-N materials. Alternatively, the E-mode transistor 52 and/or the D-mode transistor 53 can be a Ga-face or III-face or III-polar III-N device. A Ga-face or III-face or III-polar III-N device can include III-N materials grown with a group III-face or [0 0 0 1] face furthest from the growth substrate, or can include source, gate, or drain electrodes on a group III-face or [0 0 0 1] face of the III-N materials. The D-mode transistor 73 has a threshold voltage of less than 0V, such as less than −3V, less than −5V, less than −10V, less than −15V, or less than −20V. The E-mode transistor 72 has a threshold voltage greater than 0V, such as greater than 1V, greater than 1.5V, or greater than 2V.

In some implementations, the temperature at which off-state drain leakage current of the E-mode transistor 72 under the first bias condition is greater than off-state source leakage current of D-mode transistor 73 under the second bias condition is greater than the temperature at which off-state drain current of the E-mode transistor 72 under the third bias condition is less than the off-state source current of the D-mode transistor 73 under the second bias condition. For example, when the E-mode transistor 72 is a silicon-based transistor and the D-mode transistor 73 is a III-N transistor, the III-N transistor can be configured to exhibit lower off-state source currents at room temperature (25° C.) than the silicon-based transistor, for example by adjusting the compositions or material parameters of the semiconductor materials that make up the III-N transistor, as was illustrated in FIG. 4B. However, at temperatures significantly below or significantly above room temperature, the silicon-based transistor may exhibit lower off-state currents than the III-N transistor. The hybrid device 75 is typically configured or rated to operate at a range of temperatures, for example between and including −55° C. and 200° C., such as between and including −40° C. and 175° C. Hence, the resistance value of resistor 74 can be chosen to ensure that in the off state, $V_{DS,E} < V_{br,E}$ and $I_{D,off}$ is less than the critical value that causes voltage fluctuations at all operating temperatures. Additionally, the critical value of $I_{D,off}$ can depend on temperature as well, typically increasing as temperature increases. Hence, the hybrid component can be configured to allow for larger off-state currents at higher temperatures.

Figure 6:
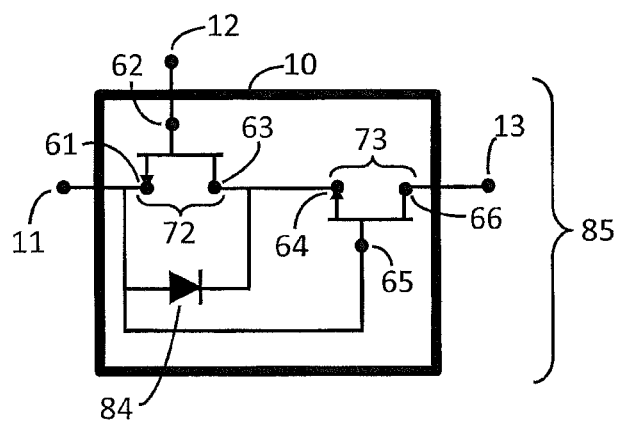

The hybrid electronic component 85 of FIG. 6 is similar to that of FIG. 5, except that the current-carrying component which serves to reduce $V_{DS,E}$ during off-state operation is a diode 84, for example a Schottky diode or a Zener diode. In hybrid component 85, the anode of diode 84 is connected to the source 61 of E-mode transistor 72, and the cathode of diode 84 is connected to the drain 63 of E-mode transistor 72. In the case where diode 84 is a Schottky diode, when the hybrid component 85 is biased in the off state, the Schottky diode is reverse biased, and hence the diode reverse saturation current flows through diode 84. Because the Schottky reverse saturation current is temperature dependent, the amount of current flowing through the Schottky diode varies with the operating temperature of the hybrid component 85. In some cases, this can be advantageous, since the relative leakage currents in the E-mode transistor 72 and the D-mode transistor 73 vary with temperature as well, and so the optimal amount of current that the diode 84 needs to carry varies with temperature as well. Hence, in some applications, the hybrid component 85 can be designed such that the temperature dependence of the diode current closely matches that which is optimal for achieving high reliability. In other applications, a diode 84 connected in parallel with a resistor, such as resistor 74 in FIG. 5, can be used as the current-carrying component in order to insure that the temperature dependence of the current-carrying component closely matches that which is optimal for achieving high reliability.

In cases where a Zener diode, or alternatively a series of Zener diodes, is used for diode 84, the turn-on voltage $V_{ON}$ of the Zener diode (or the combined turn-on voltage of all the series Zener diodes) can be less than $V_{br,E}$. Inclusion of a Zener diode 84 ensures that $V_{DS,E}$ (and therefore $|V_{GS,D}|$) does not exceed the turn-on voltage $V_{ON}$ (i.e., the Zener voltage in the case of Zener diodes) of the diode. Therefore, if a diode with a turn-on voltage which is less than $V_{br,E}$ is used, the source-drain voltage of the E-mode transistor is 72 is kept below $V_{br,E}$ during operation, which can improve device reliability. However, if the turn-on voltage of the Zener diode is too small, for example less than or much less than $|V_{th,D}|$, off-state currents through the D-mode transistor 73 may be too high, thereby degrading device reliability.

In some implementations, for example applications in which the total off-state current that flows through the source of the D-mode transistor 73 is much greater than the maximum off-state current that can be carried through the drain of the E-mode transistor 72 with $V_{DS,E} < V_{br,E}$ a diode configured to be forward biased when the hybrid component 85 is off can be used. In this case, the anode of the diode is connected to the drain 63 of the E-mode transistor 72, and the cathode of the diode is connected to the source 61 of the E-mode transistor 72. Here, the forward turn-on voltage of the diode is less than $V_{br,E}$. However, if the turn-on voltage of the diode is too small, for example less than or much less than $|V_{th,D}|$, off-state currents through the D-mode transistor 73 may be too high, thereby degrading device reliability.

In the case of a forward-biased diode, as described above, all off-state current in excess of the maximum amount that can be carried through the drain of the E-mode transistor 72 with $V_{DS,E} < V_{br,E}$ flows through the diode. In some cases, at least at one temperature, the total off-state current that flows through the D-mode transistor 73, i.e., through the source 64 of the D-mode transistor, is much greater than the maximum off-state current that can be carried by the E-mode transistor 72, i.e., through the drain 63 of the E-mode transistor, with $V_{DS,E},E < V_{br,E}$, for example at least 2 times, at least 5 times, or at least 10 times greater. At such temperatures, the current that flows through the diode 84 is greater than the off-state drain current flowing through the E-mode transistor 72.

Figure 7:
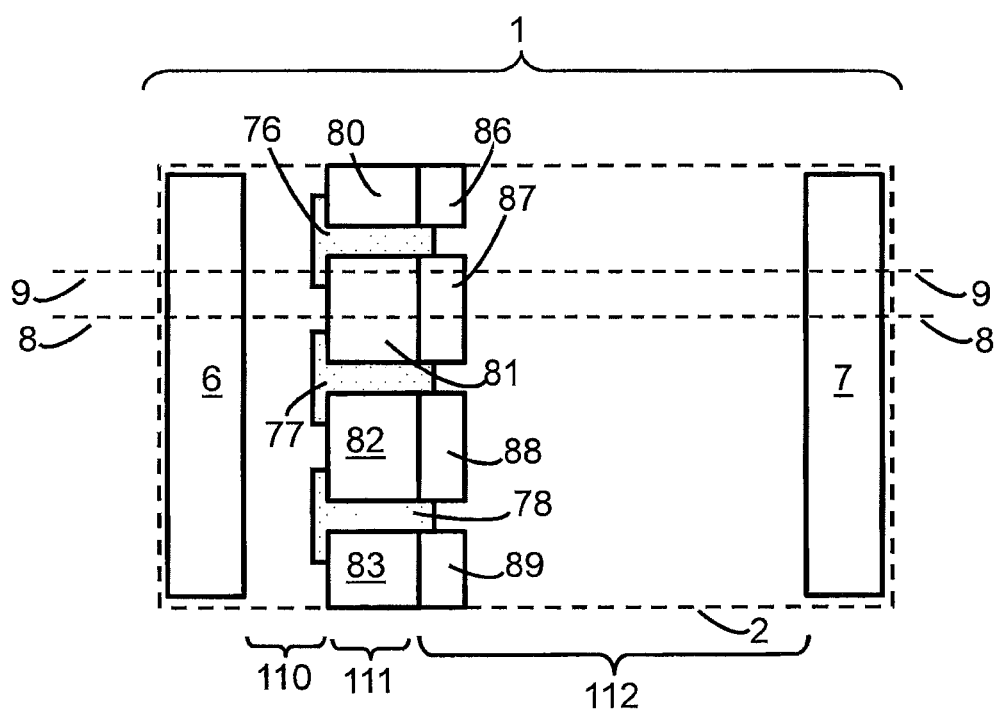
FIG. 7 is a plan view (top view) of a device which includes a depletion-mode transistor with an integrated Schottky diode.
Figure 8:
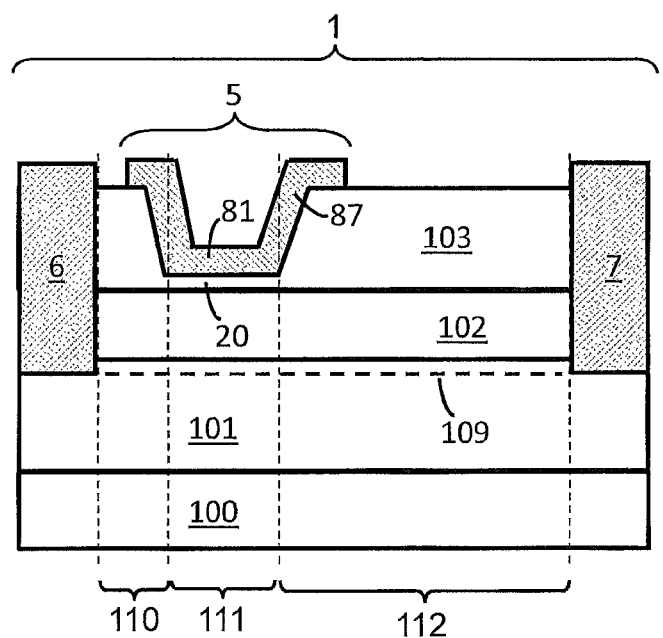
FIG. 8 is a cross-sectional view of the device of FIG. 7 along dashed line 8.
Figure 9:
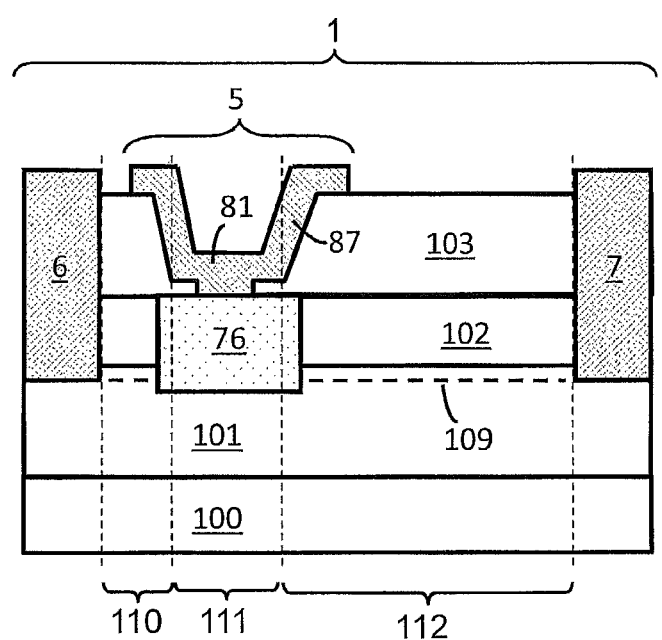
FIG. 9 is a cross-sectional view of the device of FIG. 7 along dashed line 9.

When a Schottky diode is used for diode 84, as was described above, the Schottky diode 84 can be a discreet device, or it can alternatively be integrated into the D-mode transistor 73, as illustrated by way of example in FIGS. 7-9. FIG. 7 illustrates a plan view (top view) of a device 1 which includes a D-mode III-N transistor with an integrated Schottky diode, and FIGS. 8 and 9 show cross-sectional views along dashed lines 8 and 9, respectively, of FIG. 7. Referring to FIGS. 8 and 9, the device 1 includes a III-N channel layer 101 and a III-N barrier layer 102 formed on a substrate 100. The III-N barrier layer 102 has a wider bandgap than the III-N channel layer 101, the compositional difference between the two layers resulting in a two-dimensional electron gas (2DEG) channel 109 being induced in the channel layer 101 adjacent to the interface between the channel and barrier layers 101 and 102, respectively. Electrodes 6 and 7 contact the 2DEG channel 109 and serve as the source and drain, respectively, of the D-mode transistor. Layer 103 is an insulator layer, which can for example be formed of SiN, AlN, $SiO_x$, or combinations of these materials and/or other oxides and nitrides. Layer 103 serves as a surface passivation layer for the underlying semiconductor materials, as well as a gate insulator in region 20 (see FIG. 8).

Referring to FIG. 7, in the device gate region 111, the device 1 includes regions 76-78 in which the semiconductor material is rendered p-type or semi-insulating, for example by doping via ion-implantation. The portions of the device in gate region 111 between doped regions 76-78 (i.e., the portions of the gate region 111 which lack implanted ions), along with access regions 110 and 112, all contain the 2DEG channel 109 and serve as the channel of the D-mode transistor. Hence, D-mode transistor current flows from source 6 to drain 7 (or from drain 7 to source 6) between the ion-implanted regions 76-78.

As seen in FIGS. 7 and 8, electrodes 5 are formed over the 2DEG channel in the gate region. Each electrode 5 includes a gate (80-83 in FIG. 7) and a field plate (86-89 in FIG. 7). The electrodes 5 are all electrically connected, for example outside the device periphery 2. Alternatively, electrode 5 can be a single electrode extending across the entire gate region 111 (not shown). As seen in FIGS. 7 and 9, the electrodes 5 are also at least partially over the implanted regions 76-78, with a portion of the electrodes 5 directly contacting the implanted regions 76-78. Hence, a Schottky diode is formed in device 1, with electrodes 5 (which also serve as the gate of the D-mode transistor) serving as the anode, and electrode 6 (which also serves as the source of the D-mode transistor) serving as the cathode. Current flowing through the diode flows from the anode to the cathode (or from the cathode to the anode) through the portion of the 2DEG in the source access region 110. Hence, the portion of the 2DEG channel 109 in the source access region 110 serves as a channel (or at least a portion of the channel) for current in both the Schottky diode and the D-mode transistor. In other words, a common channel is shared by the Schottky diode and the D-mode transistor of device 1.

Referring to FIG. 6, the anode of diode 84 is electrically connected to the gate 65 of D-mode transistor 73 (since gate 65 is connected to source 61 of the E-mode transistor 72), and the cathode of diode 84 is electrically connected to the source 64 of D-mode transistor 73 (since source 64 is connected to drain 63 of the E-mode transistor 72). Hence, even though the diode in the device 1 of FIGS. 7-9 is integrated with the D-mode transistor, when the device 1 is used for D-mode transistor 73 and diode 84 in FIG. 6, the integrated diode is effectively configured as shown in FIG. 6. In some implementations, in hybrid component 85 of FIG. 6, diode 84 and D-mode transistor 73 are integrated into a single device 1, as in FIGS. 7-9, and the hybrid component further includes a resistor connected in parallel to the E-mode transistor 72, as in FIG. 5.

In some implementations, the diode 84 of FIG. 6 is integrated with the D-mode transistor 73, similar to device 1 shown in FIGS. 7-9, except that the diode 84 and the D-mode transistor 73 do not share a common channel. In this case, while the diode 84 and D-mode transistor 73 are still formed adjacent to one another on the same semiconductor chip, the anode of the diode is formed adjacent to and is electrically connected to the gate of the D-mode transistor, and the cathode of the diode is formed adjacent to and is electrically connected to the source of the D-mode transistor. The channels of the diode and D-mode transistor are both in the same material layer and can be adjacent to one another; however, no portion of the diode channel is shared with any portion of the D-mode transistor channel.

Figure 10:
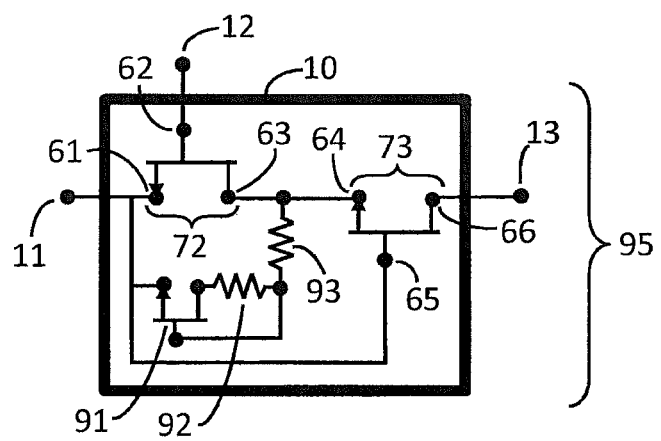
FIGS. 10 and 11 are circuit schematics of hybrid electronic components.
Figure 11:
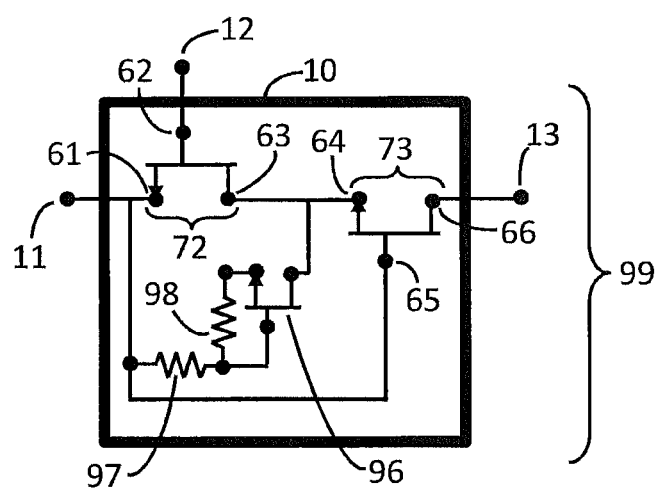

Hybrid electronic components 95 and 99, which employ current-carrying components that include a combination of transistors and resistors, are shown in FIGS. 10 and 11. Referring to FIG. 10, the current-carrying component includes an enhancement-mode transistor 91, and optionally resistors 92 and 93. The source of enhancement-mode transistor 91, which serves as one of the two terminals of the current-carrying component, is connected to the source 61 of E-mode transistor 72. A first terminal of resistor 93, which serves as the other of the two terminals of the current-carrying component, is connected to the drain 63 of the E-mode transistor 72. The opposite terminal of resistor 93 is connected to a first terminal of resistor 92 and to the gate of the enhancement-mode transistor 91. The second terminal of resistor 92 is connected to the drain of the enhancement-mode transistor 91. The relative resistances of resistors 92 and 93, as well as the size, geometry, and/or threshold voltage of the enhancement-mode transistor 91, can be selected to optimize the resulting drain-source voltage across E-mode transistor 72 during off-state operation. Resistors 92 and 93 divide the voltage between the drain 63 of the E-mode transistor 72 and the drain of enhancement-mode transistor 91 in order to supply a voltage to the gate of enhancement-mode transistor 91. Hence, their relative resistances are chosen to supply a suitable operating gate voltage for enhancement-mode transistor 91. The specific value of gate voltage suitable for operation of enhancement-mode transistor 91 depends on the specific design of enhancement-mode transistor 91.

In cases where resistor 93 is not included (not shown), the gate of enhancement-mode transistor 91 and the first terminal of resistor 92 are connected to form the terminal of the current-carrying component which is connected to the drain 63 of the E-mode transistor 72. In cases where resistor 92 is not included (not shown), the gate and drain of enhancement-mode transistor 91 are connected together. In cases where both resistors 92 and 93 are not included (not shown), the gate and drain of enhancement-mode transistor 91 are connected together to form the terminal of the current-carrying component which is connected to the drain 63 of the E-mode transistor 72.

Referring to FIG. 11, the current-carrying component includes a depletion-mode transistor 96, and optionally resistors 97 and 98. The drain of depletion-mode transistor 96, which serves as one of the two terminals of the current-carrying component, is connected to the drain 63 of E-mode transistor 72. A first terminal of resistor 97, which serves as the other of the two terminals of the current-carrying component, is connected to the source 61 of the E-mode transistor 72. The opposite terminal of resistor 97 is connected to a first terminal of resistor 98 and to the gate of the depletion-mode transistor 96. The second terminal of resistor 98 is connected to the source of the depletion-mode transistor 96. The relative resistances of resistors 97 and 98, as well as the size, geometry, and/or threshold voltage of the depletion-mode transistor 96, can be selected to optimize the resulting drain-source voltage across E-mode transistor 72 during off-state operation.

In cases where resistor 97 is not included (not shown), the gate of depletion-mode transistor 96 and the first terminal of resistor 98 are connected to form the terminal of the current-carrying component which is connected to the source 61 of the E-mode transistor 72. In cases where resistor 98 is not included (not shown), the gate and source of depletion-mode transistor 96 are connected together. In cases where both resistors 97 and 98 are not included (not shown), the gate and source of enhancement-mode transistor 91 are connected together to form the terminal of the current-carrying component which is connected to the source 61 of the E-mode transistor 72.

Figure 12:
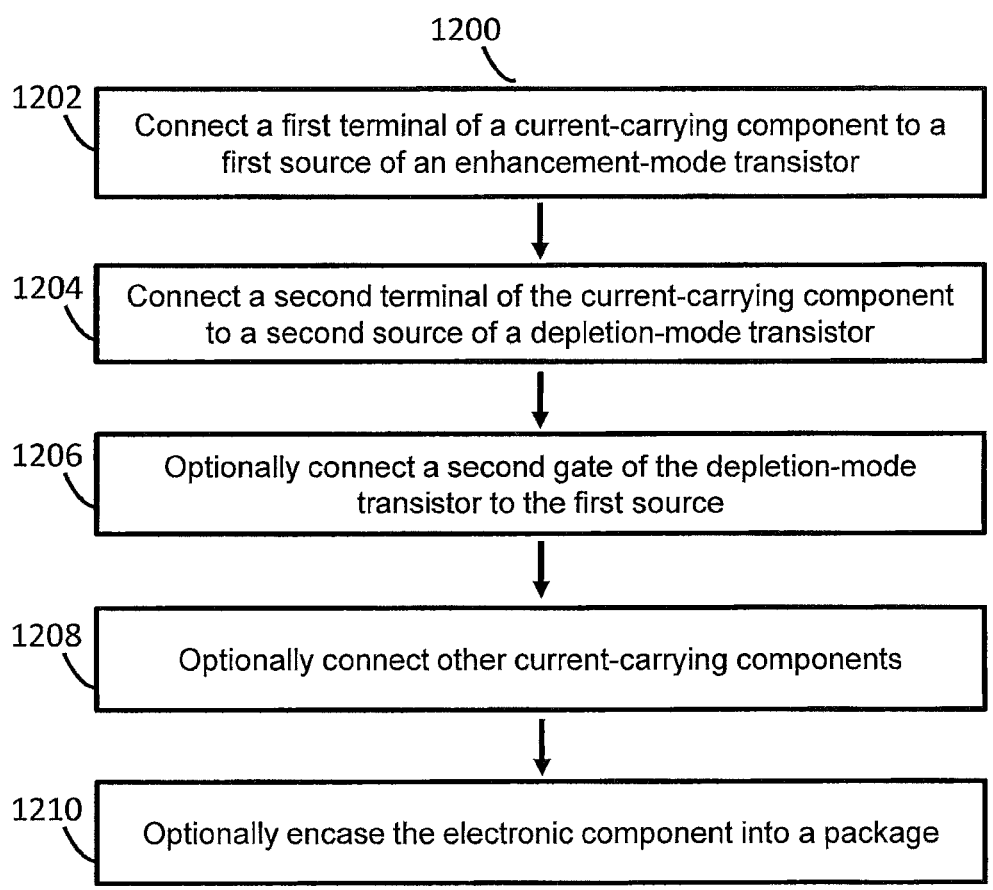
FIG. 12 is a flow diagram of an example process for producing electronic components.

FIG. 12 is a flow diagram of an example process 1200 for producing an electronic component, e.g., one of the hybrid devices described above.

A first terminal of a current-carrying device is electrically connected to a first source of an enhancement-mode transistor (step 1202). The current-carrying device can be, for example, a resistor or a diode (e.g., as shown in FIGS. 5 and 6.) The enhancement mode transistor has a first breakdown voltage and a first threshold voltage. The enhancement-mode transistor includes the first source, a first gate, and a first drain.

A second terminal of the current-carrying component is connected to the first drain and a second source of a depletion-mode transistor (step 1204). The depletion-mode transistor has a second breakdown voltage which is larger than the first breakdown voltage. The depletion-mode transistor has a second threshold voltage. The depletion-mode transistor includes the second source, a second gate, and a second drain. The enhancement-mode transistor can be a silicon-based transistor, and the depletion-mode transistor can be a III-N transistor.

The current-carrying component is configured to reduce, compared to an electronic component lacking the current-carrying component, a voltage of the first drain relative to the first source when the electronic component is biased such that a voltage of the first gate relative to the first source is less than the first threshold voltage and a voltage of the second drain relative to the first source is greater than the first breakdown voltage and less than the second breakdown voltage. For example, this reduction in voltage can be achieved when the current-carrying component is a resistor or a diode or a combination of resistors and diodes (e.g., as shown in FIGS. 10 and 11.)

Typically, the second gate of the depletion-mode transistor is connected to the first source of the enhancement-mode transistor (step 1206). The second gate can alternatively be connected to one or more other current carrying devices that are coupled to the first source of the enhancement-mode transistor.

The electronic component including the enhancement-mode transistor and the depletion-mode transistor can optionally be encased into a package. Encasing the component into a package can include connecting the second drain to a package drain terminal, connecting the first source to a package source terminal, and connecting the first gate to a package gate terminal.

A number of implementations have been described. Nevertheless, it will be understood that various modifications may be made without departing from the spirit and scope of the techniques and devices described herein. For example, various 2-terminal current-carrying components may be connected in parallel to form a single 2-terminal current-carrying component for which the temperature dependence of the current passing through the single 2-terminal current-carrying component is optimal over the entire range of operating temperatures. Or, off-state current at the drain of the D-mode transistor may be greater than off-state current at the source, for example in cases where there is a measurable amount of DC and/or AC gate current. In such cases, the total off-state current through the D-mode transistor may be regarded as the off-state drain current. Accordingly, other implementations are within the scope of the following claims.

What is claimed is:

1. A method of producing an electronic component, the method comprising:
   connecting a first terminal of a resistor to a first source of an enhancement-mode transistor, the enhancement-mode transistor comprising the first source, a first gate, and a first drain; and
   directly connecting a second terminal of the resistor to the first drain and to a second source of a depletion-mode transistor, the depletion-mode transistor comprising the second source, a second gate, and a second drain.

2. The method of claim 1, further comprising connecting the second gate to the first source.

3. The method of claim 1, wherein a breakdown voltage of the depletion-mode transistor is greater than a breakdown voltage of the enhancement-mode transistor.

4. The method of claim 3, wherein the breakdown voltage of the depletion-mode transistor is at least three times the breakdown voltage of the enhancement-mode transistor.

5. The method of claim 1, wherein the enhancement-mode transistor or the depletion-mode transistor is a III-N device.

6. The method of claim 1, wherein the enhancement-mode transistor is a silicon-based transistor, and the depletion-mode transistor is a III-N transistor.

7. The method of claim 1, the enhancement-mode transistor having a threshold voltage, wherein a resistance of the resistor is sufficiently small to reduce a voltage of the first drain relative to the first source when the electronic component is biased such that a voltage of the first gate relative to the first source is less than the threshold voltage of the enhancement-mode transistor and a voltage of the second drain relative to the first source is greater than a breakdown voltage of the enhancement-mode transistor but less than a breakdown voltage of the depletion-mode transistor.

8. The method of claim 1, the enhancement-mode transistor having a threshold voltage; wherein
   when the electronic component is biased such that a voltage of the first gate relative to the first source is less than the threshold voltage of the enhancement-mode transistor and a voltage of the second drain relative to the first source is greater than a breakdown voltage of the enhancement-mode transistor but less than a breakdown voltage of the depletion-mode transistor, a first off-state leakage current flows through the depletion-mode transistor, and a second off-state leakage current which is smaller than the first off-state leakage current flows through the enhancement-mode transistor; and
   at a first temperature, a resistance of the resistor is less than the breakdown voltage of the enhancement-mode transistor divided by a difference between the second off-state leakage current and the first off-state leakage current.

9. The method of claim 1, the enhancement-mode transistor having a threshold voltage; wherein
   when the electronic component is biased such that a voltage of the first gate relative to the first source is less than the threshold voltage of the enhancement-mode transistor and a voltage of the second drain relative to the first source is greater than a breakdown voltage of the enhancement-mode transistor but less than a breakdown voltage of the depletion-mode transistor, a first off-state leakage current flows through the second source of the depletion-mode transistor, and a second off-state leakage current which is smaller than the first off-state leakage current flows through the first drain of the enhancement-mode transistor; and at a first temperature, a resistance of the resistor is less than the breakdown voltage of the enhancement-mode transistor divided by a difference between the second off-state leakage current and the first off-state leakage current.

10. The method of claim 9, wherein the first temperature is 25° C.

11. The method of claim 10, wherein the voltage of the first gate relative to the first source is 0V.

12. The method of claim 9, the electronic component rated to operate at a temperature range between and including a second temperature and a third temperature, the second temperature being less than the first temperature and the third temperature being greater than the first temperature, wherein the resistance of the resistor is less than the breakdown voltage of the enhancement-mode transistor divided by the difference between the second off-state leakage current and the first off-state leakage current at all temperatures within the temperature range.

13. The method of claim 12, wherein the second temperature is −55° C. and the third temperature is 200° C.

14. The method of claim 1, the enhancement-mode transistor having a first threshold voltage and the depletion-mode transistor having a second threshold voltage; wherein when the electronic component is biased such that a voltage of the first gate relative to the first source is less than the first threshold voltage and a voltage of the second drain relative to the first source is greater than a breakdown voltage of the enhancement-mode transistor but less than a breakdown voltage of the depletion-mode transistor, an off-state leakage current flows through the second source of the depletion-mode transistor; and at a first temperature, a resistance of the resistor is sufficiently large to prevent the off-state leakage current from exceeding a critical value.

15. The method of claim 14, wherein the first temperature is 25° C.

16. The method of claim 15, wherein the voltage of the first gate relative to the first source is 0V.

17. The method of claim 14, wherein the critical value is a value of off-state leakage current in the depletion-mode transistor during operation of the electronic component which results in fluctuations of over 10V in the second threshold voltage.

18. The method of claim 17, the electronic component rated to operate at a temperature range between and including a second temperature and a third temperature, the second temperature being less than the first temperature and the third temperature being greater than the first temperature, and the critical value being a function of temperature, wherein the resistance of the resistor is sufficiently large to prevent the off-state leakage current from exceeding the critical value at all temperatures within the temperature range.

19. The method of claim 18, wherein the second temperature is −55° C. and the third temperature is 200° C.

20. The method of claim 1, the enhancement-mode transistor having a first threshold voltage and the depletion-mode transistor having a second threshold voltage; wherein a resistance of the resistor is selected such that when the electronic component is biased such that a voltage of the first gate relative to the first source is less than the first threshold voltage and a voltage of the second drain relative to the first source is greater than a breakdown voltage of the enhancement-mode transistor but less than a breakdown voltage of the depletion-mode transistor, at a temperature of 25° C. a difference between a voltage of the second gate relative to the second source and the second threshold voltage is less than 10V.

21. The method of claim 20, the electronic component rated to operate at a temperature range between and including a first temperature and a second temperature, wherein the difference between the voltage of the second gate relative to the second source and the second threshold voltage is less than 5V at all temperatures within the temperature range.

22. The method of claim 21, wherein the first temperature is −55° C. and the second temperature is 200° C.

23. The method of claim 1, wherein an absolute value of a threshold voltage of the depletion-mode transistor is smaller than a breakdown voltage of the enhancement-mode transistor.

24. The method of 23, wherein the absolute value of the threshold voltage of the depletion-mode transistor is about 10V or larger.

25. The method of claim 1, wherein the resistor has a resistance between $10^3$ ohms and $10^9$ ohms.

26. The method of claim 1, further comprising providing a diode having an anode and a cathode, wherein the anode is connected to the first source or to the second gate, and the cathode is electrically connected to the first drain or to the second source.

27. The method of claim 26, wherein the diode and the depletion-mode transistor are integrated into a single device.

28. The method of claim 27, wherein the single device is a III-N device.

29. A method of producing an electronic component, the method comprising:

connecting a current-carrying component comprising a resistor in parallel with an enhancement-mode transistor, the enhancement-mode transistor having a first breakdown voltage, the enhancement-mode transistor comprising a first source, a first gate, and a first drain;

connecting the first drain to a second source of a depletion-mode transistor, the depletion-mode transistor having a second breakdown voltage which is larger than the first breakdown voltage, the depletion-mode transistor comprising the second source, a second gate, and a second drain; and electrically connecting the second gate to the first source.

30. The method of claim 29, wherein a first terminal of the current-carrying component is electrically connected to the first source, and a second terminal of the current-carrying component is electrically connected to the first drain or to the second source.

31. The method of claim 29, wherein the enhancement-mode transistor or the depletion-mode transistor is a III-N device.

32. The method of claim 29, wherein the enhancement-mode transistor is a silicon-based transistor, and the depletion-mode transistor is a III-N transistor.

* * * * *

UNITED STATES PATENT AND TRADEMARK OFFICE
CERTIFICATE OF CORRECTION

PATENT NO.         : 9,171,836 B2                                    Page 1 of 1
APPLICATION NO.    : 14/478504
DATED              : October 27, 2015
INVENTOR(S)        : Rakesh K. Lal et al.

It is certified that error appears in the above-identified patent and that said Letters Patent is hereby corrected as shown below:

Claims

Column 26, line 25, in claim 24: Delete "method of" and insert --method of claim--, therefor.

Signed and Sealed this
Fifth Day of April, 2016

Michelle K. Lee
*Director of the United States Patent and Trademark Office*